(12) United States Patent
Kamimura

(10) Patent No.: US 12,276,915 B2
(45) Date of Patent: Apr. 15, 2025

(54) TREATMENT LIQUID AND TREATMENT METHOD

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1115 days.

(21) Appl. No.: 16/984,737

(22) Filed: Aug. 4, 2020

(65) Prior Publication Data

US 2020/0363725 A1 Nov. 19, 2020

Related U.S. Application Data

(63) Continuation of application No. PCT/JP2019/002508, filed on Jan. 25, 2019.

(30) Foreign Application Priority Data

Feb. 5, 2018 (JP) ................................. 2018-018014

(51) Int. Cl.
| | | |
|---|---|---|
| C23F 1/10 | (2006.01) | |
| C23F 11/14 | (2006.01) | |
| G03F 7/11 | (2006.01) | |
| G03F 7/42 | (2006.01) | |

(52) U.S. Cl.
CPC ................ *G03F 7/425* (2013.01); *C23F 1/10* (2013.01); *C23F 11/144* (2013.01); *C23F 11/149* (2013.01); *G03F 7/11* (2013.01)

(58) Field of Classification Search
CPC .... G03F 7/425; C23F 1/10; C23F 1/32; C23F 11/144; C23F 11/149
See application file for complete search history.

(56) References Cited

U.S. PATENT DOCUMENTS

| | | | |
|---|---|---|---|
| 2006/0016785 A1 | 1/2006 | Egbe et al. | |
| 2008/0242574 A1 | 10/2008 | Rath et al. | |
| 2011/0281436 A1 | 11/2011 | Inaba et al. | |
| 2013/0274161 A1* | 10/2013 | Woodward | C10M 129/02 508/306 |
| 2014/0014615 A1 | 1/2014 | Yube et al. | |
| 2014/0377581 A1* | 12/2014 | Uchikawa | C23C 28/345 205/199 |
| 2015/0344813 A1* | 12/2015 | Strong | C10M 161/00 508/306 |
| 2016/0130500 A1* | 5/2016 | Chen | C11D 7/06 216/13 |
| 2017/0037344 A1* | 2/2017 | Chang | C11D 7/5013 |
| 2018/0100128 A1* | 4/2018 | Park | C11D 7/3245 |
| 2019/0079409 A1 | 3/2019 | Takahashi et al. | |

FOREIGN PATENT DOCUMENTS

| | | | |
|---|---|---|---|
| JP | 2006-096984 A | 4/2006 | |
| JP | 2008-109076 A | 5/2008 | |
| JP | 2008-546036 A | 12/2008 | |
| JP | 2009-212383 A | 9/2009 | |
| JP | 2011192743 A * | 9/2011 | |
| JP | 2011-243610 A | 12/2011 | |
| JP | 2013-101224 A | 5/2013 | |
| JP | 2013-234385 A | 11/2013 | |
| WO | WO-2008100377 A1 * | 8/2008 | ......... C11D 11/0047 |
| WO | 2017024140 A1 | 2/2017 | |
| WO | 2017208767 A1 | 12/2017 | |

OTHER PUBLICATIONS

"Citric acid" via https://drugcentral.org/drugcard/666 ; pp. 1-7; No Data available.*
Wikipedia, "Silicotungstic acid" via https://en.wikipedia.org/wiki/Silicotungstic_acid ; pp. 1-5 (Year: 2023).*
Wikipeida, "Tetramethylammonium hydroxide" via https://en.wikipedia.org/wiki/Tetramethylammonium_hydroxide ; pp. 1-5 (Year: 2023).*
Wikipedia, "Peracetic acid" (also known as Peroxyacetic acid) via https://en.wikipedia.org/wiki/Peracetic_acid (Year: 2024).*
Wikipedia, "Methyl ethyl ketone peroxide" via https://en.wikipedia.org/wiki/Methyl_ethyl_ketone_peroxide (Year: 2024).*
National Library of Medicine, "tert-Butyl cumyl peroxide" https://pubchem.ncbi.nlm.nih.gov/compound/tert-Butyl-cumyl-peroxide (Year: 2024).*
Ramana Rao, "Isopoly-Molybdic Acids", Analytica Chimica ACT, vol. 12 (Year: 1995).*
Notice of Reasons for Refusal dated Apr. 5, 2022 from the Japanese Patent Office in JP Application No. 2019-569081.
International Search Report dated May 7, 2019 from the International Searching Authority in International Application No. PCT/JP2019/002508.
Written Opinion dated May 7, 2019 from the International Bureau in International Application No. PCT/JP2019/002508.
International Preliminary Report on Patentability dated Aug. 11, 2020 from the International Bureau in International Application No. PCT/JP2019/002508.
Notice of Reasons for Refusal issued Sep. 7, 2021 by the Japanese Patent Office in Japanese.

* cited by examiner

*Primary Examiner* — Binh X Tran
(74) *Attorney, Agent, or Firm* — Sughrue Mion, PLLC

(57) ABSTRACT

An object of the present invention is to provide a treatment liquid having excellent resist film removal performance and excellent residue removal performance. Another object of the present invention is to provide a treatment method. The treatment liquid of an embodiment of the present invention is a treatment liquid containing an alkali compound and a hydroxycarboxylic acid, in which abrasive particles are not substantially contained, and a content mass ratio of a content of the hydroxycarboxylic acid to a content of the alkali compound is 0.001 and 1.0.

19 Claims, No Drawings

TREATMENT LIQUID AND TREATMENT METHOD

CROSS-REFERENCE TO RELATED APPLICATIONS

This application is a Continuation of PCT International Application No. PCT/JP2019/002508 filed on Jan. 25, 2019, which claims priority under 35 U.S.C. § 119(a) to Japanese Patent Application No. 2018-018014 filed on Feb. 5, 2018. The above application is hereby expressly incorporated by reference, in its entirety, into the present application.

BACKGROUND OF THE INVENTION

1. Field of the Invention

The present invention relates to a treatment liquid and a treatment method.

2. Description of the Related Art

A photolithography process using a positive tone or negative tone photoresist has been employed for the manufacture of semiconductor integrated circuits.

In the photolithography process, a patterned resist film obtained by exposing a composition layer for forming a resist film through a photomask is arranged on a substrate. Next, etching and/or ion implantation of a semiconductor substrate is performed using the obtained resist pattern as a mask.

In a case where a metal-containing layer and/or an insulating layer on a substrate is etched by dry etching such as plasma etching using a patterned resist film as a mask, residues derived from the resist film, the metal-containing layer, and the insulating layer are generated on a semiconductor substrate. The residues generated on the substrate by dry etching are removed by washing the substrate with a treatment liquid.

Moreover, the resist film which becomes unnecessary is thereafter removed from the substrate. A removal method therefor includes a wet method with a treatment liquid and a dry method by ashing. Examples of the ashing include plasma ashing. In the method by plasma ashing, an electric field is applied to oxygen plasma in a vacuum chamber to accelerate the ashing in the direction of the electric field, thereby ashing a resist pattern. A residue of the resist film generated on the substrate by ashing is removed by washing the substrate with a treatment liquid.

In addition, examples of the wet method include a method in which a resist film is peeled from a substrate with a treatment liquid and removed.

As such a treatment liquid, "a washing composition for removing a plasma etching residue and/or an ashing residue formed on a semiconductor substrate, the washing composition including (Component a) water, (Component b) an amine compound, (Component c) a hydroxylamine and/or a salt thereof, (Component d) a quaternary ammonium compound, (Component e) an organic acid, and (Component f) a water-soluble organic solvent, and having a pH of 6 to 9, is described in JP2011-243610A.

SUMMARY OF THE INVENTION

The present inventors have conducted studies on a washing composition described in JP2011-243610A, and have thus found that there is room for improvement of resist film removal performance and residue removal performance.

Therefore, an object of the present invention is to provide a treatment liquid having excellent resist film removal performance and excellent residue removal performance.

Another object of the present invention is to provide a treatment method.

The present inventors have conducted intensive studies to solve the problems, and as a result, have found that the problems can be solved by the following configuration.

[1] A treatment liquid comprising:
at least one alkali compound selected from the group consisting of a quaternary ammonium salt and an inorganic alkali compound; and
a hydroxycarboxylic acid,
in which abrasive particles are not substantially contained, and a content mass ratio of a content of the hydroxycarboxylic acid to a content of the alkali compound is 0.001 and 1.0.

[2] The treatment liquid as described in [1],
in which a C log P value of the hydroxycarboxylic acid is −1 or less.

[3] The treatment liquid as described in [1] or [2],
in which the hydroxycarboxylic acid is at least one selected from the group consisting of citric acid, tartaric acid, glycolic acid, 2-hydroxyisobutyric acid, glyceric acid, malic acid, and gluconic acid.

[4] The treatment liquid as described in any one of [1] to [3],
in which the content of the hydroxycarboxylic acid is 0.01 ppm by mass to 5% by mass with respect to a total mass of the treatment liquid.

[5] A treatment liquid comprising:
at least one polyacid compound selected from the group consisting of an isopolyacid and a heteropolyacid; and
an alkali compound,
in which abrasive particles are not substantially contained.

[6] The treatment liquid as described in [5],
in which a content of the polyacid compound is 0.01 ppm by mass to 5% by mass with respect to a total mass of the treatment liquid.

[7] The treatment liquid as described in [5] or [6],
in which a content mass ratio of a content of the polyacid compound to a content of the alkali compound is 1 or less.

[8] The treatment liquid as described in any one of [1] to [7],
in which an electrical conductivity is 50 to 10,000 mS/cm.

[9] The treatment liquid as described in any one of [1] to [8],
in which the treatment liquid is at least one selected from the group consisting of an etching liquid and a washing liquid.

[10] The treatment liquid as described in any one of [1] to [9],
in which a pH is 7.5 to 14.

[11] The treatment liquid as described in any one of [1] to [10],
in which the alkali compound includes a quaternary ammonium salt.

[12] The treatment liquid as described in any one of [1] to [11], further comprising an organic solvent.

[13] The treatment liquid as described in [12],
in which a content of the organic solvent is 30% to 95% by mass with respect to a total mass of the treatment liquid.

[14] The treatment liquid as described in [12] or [13], in which the content of the organic solvent is 60% to 95% by mass with respect to a total mass of the treatment liquid.

[15] The treatment liquid as described in any one of [12] to [14], in which the organic solvent is at least one selected from the group consisting of an alcohol-based solvent, an ether-based solvent, and a sulfoxide-based solvent.

[16] The treatment liquid as described in any one of [1] to [15], further comprising a hydroxylamine compound.

[17] The treatment liquid as described in any one of [1] to [16], further comprising an anticorrosive agent for tungsten.

[18] The treatment liquid as described in [17], in which the anticorrosive agent for tungsten is at least one selected from the group consisting of a compound having a triazole skeleton, a hydrophilic polymer, an amino acid, and a guanidine compound.

[19] A method for treating a laminate having a substrate and at least one layer selected from the group consisting of a resist layer and a metal-containing layer, arranged on the substrate, the method comprising at least one step selected from the group consisting of:

a step of removing at least one layer selected from the group consisting of the resist layer and the metal-containing layer on the substrate using the treatment liquid as described in any one of [1] to [18]; and a step of removing a residue derived from at least one layer selected from the group consisting of the resist layer and the metal-containing layer on the substrate using the treatment liquid.

[20] The treatment method as described in [19], in which the metal-containing layer contains at least one metal selected from the group consisting of Ti, Hf, Ta, and Zr.

[21] The treatment method as described in [19] or [20], in which the laminate further has a layer containing Co.

[22] The treatment method as described in any one of [19] to [21], in which the laminate further has a layer containing Al, $AlO_x$, and AlN, and x is a number of 1 to 3.

[23] The treatment method as described in any one of [19] to [22], in which the laminate further has a layer containing W.

[24] The treatment method as described in any one of [19] to [23], in which a temperature of the treatment liquid during the treatment is 23° C. to 75° C.

[25] The treatment method as described in any one of [19] to [24], in which the substrate has a layer containing at least one selected from the group consisting of Co, Al, $AlO_x$, and AlN, x is a number of 1 to 3, and an etching removal rate of the layer derived from values before and after the treatment is 3.0 nm or less.

According to the present invention, it is possible to provide a treatment liquid having excellent resist film removal performance and excellent residue removal performance.

Furthermore, according to the present invention, it is also possible to provide a treatment method.

DESCRIPTION OF THE PREFERRED EMBODIMENTS

Hereinafter, the present invention will be described in detail.

The description of the constituents described below is sometimes made based on representative embodiments of the present invention, but the present invention is not limited to such embodiments.

In addition, in the present specification, a numerical value range expressed using "to" means a range that includes the preceding and succeeding numerical values of "to" as the lower limit value and the upper limit value, respectively.

Furthermore, in the present invention, "preparation" means not only synthesis or combination of specific materials for preparation but also procurement of a predetermined product through purchase or the like.

Incidentally, in the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

Moreover, in the present invention, 1 Å (angstrom) corresponds to 0.1 nm.

In addition, in the notation of a group (atomic group) in the present invention, in a case where the group is noted without specifying whether it is substituted or unsubstituted, the group includes both a group having no substituent and a group having a substituent within a range not interfering with the effects of the present invention. For example, a "hydrocarbon group" includes not only a hydrocarbon group having no substituent (an unsubstituted hydrocarbon group) but also a hydrocarbon group having a substituent (a substituted hydrocarbon group). This also applies to each of compounds.

In addition, a "radiation" in the present invention means, for example, far ultraviolet rays, extreme ultraviolet rays (EUV), X-rays, electron beams, or the like. Incidentally, in the present invention, light means actinic rays or radiation. Unless otherwise specified, "exposure" in the present invention includes not only exposure by far ultraviolet rays, X-rays, EUV, or the like but also writing by particle rays such as electron beams and ion beams.

Moreover, in the present specification, a method for evaluating defect suppression performance of a treatment liquid is a method using a wafer top surface inspection device (SP-5, manufactured by KLA-Tencor Corporation), and the details of the procedure are as described in Examples. A principle of defect detection using this device is as follows. First, a treatment liquid is applied to a wafer, and the wafer surface having the treatment liquid applied thereon is irradiated with laser beams. Next, in a case where the laser beams hit a foreign matter and/or a defect, light is scattered, the scattered light is detected by a detector, and thus, the foreign matter and the defect are detected. In addition, by performing measurement while rotating the wafer upon irradiation with the laser beams, the coordinate position of the foreign matter and the defect can be determined from a rotation angle of the wafer and a radial position of the laser beams.

The defect suppression performance of the treatment liquid can be evaluated with any of inspection devices based on the same measurement principle even though the inspection device is other than SP-5. Examples of such an inspection device include Surfscan series manufactured by KLA-Tencor Corporation. In particular, for the evaluation of the defect suppression performance of the treatment liquid used in the manufacture of a fine semiconductor device with a 10-nm or less node, the "SP-5" or a wafer top surface inspection device (typically a successor model following "SP-5", or the like) having a resolution which is no lower than the resolution of "SP-5") is preferably used.

Treatment Liquid (First Embodiment)

The treatment liquid according to a first embodiment of the present invention is a treatment liquid containing an alkali compound and a hydroxycarboxylic acid, in which abrasive particles are not substantially contained, and a content mass ratio of a content of the hydroxycarboxylic acid and a content of the alkali compound is 0.001 to 1.0.

[Alkali Compound]

The treatment liquid contains at least one alkali compound selected from the group consisting of a quaternary ammonium salt and an inorganic alkali compound. The content of the alkali compound in the treatment liquid is not particularly limited, but is generally preferably 0.1% to 15% by mass, and more preferably 1% to 10% by mass, with respect to a total mass of the treatment liquid. The alkali compound may be used singly or in combination of two or more kinds thereof. In a case where two or more kinds of the alkali compounds are used in combination, a total content thereof is preferably within the range.

A content mass ratio (hydroxycarboxylic acid/alkali compound) of the content of the hydroxycarboxylic acid which will be described later to the content of the alkali compound (in a case where two or more kinds of the alkali compounds are contained, the content is a total amount of the alkali compounds; the same applies hereinafter) in the treatment liquid is 0.001 to 1.0, preferably 0.01 to 0.7, more preferably 0.05 to 0.5, still more preferably 0.05 to 0.2, and particularly preferably 0.06 to 0.15. In a case where the hydroxycarboxylic acid/alkali compound is 0.001 or more, the treatment liquid has excellent residue removal performance, and in a case where the hydroxycarboxylic acid/alkali compound is 1 or less, the treatment liquid has excellent anticorrosion performance against a metal.

As the quaternary ammonium salt, a compound represented by Formula (1) is preferable, and above all, tetramethylhydroxylammonium or tetrabutylhydroxylammonium is more preferable.

Examples of the inorganic alkali compound include alkali metal hydroxides such as sodium hydroxide, potassium hydroxide, and lithium hydroxide; alkali metal carbonates such as sodium carbonate, potassium carbonate, and lithium carbonate; alkali metal bicarbonates such as sodium hydrogen carbonate, potassium hydrogen carbonate, and lithium hydrogen carbonate; and alkali metal hydrides such as lithium hydride, sodium hydride, and potassium hydride.

As the inorganic alkali compound, the alkali metal hydroxides such as sodium hydroxide, potassium hydroxide, and lithium hydroxide are preferable from the viewpoint that a treatment liquid having more excellent effects of the present invention can be obtained.

As the quaternary ammonium salt, the compound represented by Formula (1) is preferable.

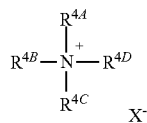

(1)

In Formula (1), $R^{4A}$ to $R^{4D}$ each independently represent an alkyl group having 1 to 6 carbon atoms, a hydroxyalkyl group having 1 to 6 carbon atoms, a benzyl group, or an aryl group. $X^-$ represents a counter anion.

In Formula (1), $R^{4A}$ to $R^{4D}$ each independently represent an alkyl group having 1 to 6 carbon atoms (for example, a methyl group, an ethyl group, and a butyl group), a hydroxyalkyl group having 1 to 6 carbon atoms (for example, a hydroxymethyl group, a hydroxyethyl group, and a hydroxybutyl group), a benzyl group, or an aryl group (for example, a phenyl group, a naphthyl group, and a naphthalene group). Among those, the alkyl group, the hydroxyethyl group, or the benzyl group is preferable.

In Formula (1), $X^-$ represents a counter anion. The counter anion is not particularly limited, but examples thereof include various acid anions such as a carboxylate ion, a phosphate ion, a sulfate ion, a phosphonate ion, and a nitrate ion, a hydroxide ion, and a halide ion (for example, a chloride ion, a fluoride ion, and a bromide ion).

Specific examples of the compound represented by Formula (1) include tetramethylammonium hydroxide (TMAH), tetraethylammonium hydroxide, tetrapropylammonium hydroxide, tetrabutylammonium hydroxide (TBAH), ethyltrimethylammonium hydroxide, trimethylhydroxyethylammonium hydroxide, methyl tri(hydroxyethyl) ammonium hydroxide, tetra(hydroxyethyl)ammonium hydroxide, benzyltrimethylammonium hydroxide, tetrapentylammonium hydroxide, tetrahexylammonium hydroxide, tetraoctylammonium hydroxide, butyltrimethylammonium hydroxide, methyltriamylammonium hydroxide, dibutyldipentylammonium hydroxide, triethylphenylammonium hydroxide, trimethylbenzylammonium hydroxide, triethylbenzylammonium hydroxide, tribenzylmethylammonium hydroxide, tetrabenzylammonium hydroxide, trimethylcyclohexylammonium hydroxide, tributylcyclohexylammonium hydroxide, monohydroxyethyltrimethylammonium hydroxide, dihydroxyethyldimethylammonium hydroxide (dimethylbis(2-hydroxyethyl)ammonium hydroxide), trihydroxyethylmonomethylammonium hydroxide, monohydroxyethyltriethylammonium hydroxide, dihydroxyethyldiethylammonium hydroxide, trihydroxyethylmonoethylammonium hydroxide, monohydroxypropyltrimethylammonium hydroxide, dihydroxypropyldimethylammonium hydroxide, trihydroxypropylmonomethylammonium hydroxide, monohydroxypropyltriethylammonium hydroxide, dihydroxypropyldiethylammonium hydroxide, trihydroxypropylmonoethylammonium hydroxide, and choline (for example, choline hydroxide).

Among those, tetramethylammonium hydroxide (TMAH), tetraethylammonium hydroxide, tetrabutylammonium hydroxide (TBAH), ethyltrimethylammonium hydroxide, dimethylbis(2-hydroxyethyl)ammonium hydroxide, benzyltrimethylammonium hydroxide, or choline hydroxide is preferable, and TMAH or TBAH is more preferable.

The quaternary ammonium salt may be used singly or in combination of two or more kinds thereof.

[Hydroxycarboxylic Acid]

The treatment liquid contains a hydroxycarboxylic acid. The hydroxycarboxylic acid is not particularly limited, and a known hydroxycarboxylic acid can be used. The content of the hydroxycarboxylic acid in the treatment liquid is not particularly limited, but is generally preferably 0.01 ppm by mass or more, more preferably 0.001% by mass or more, and still more preferably 0.005% by mass or more, and is preferably 10% by mass or less, more preferably 5% by mass or less, and still more preferably 1% by mass or less, with respect to the total mass of the treatment liquid. The hydroxycarboxylic acid may be used singly or in combination of two or more kinds thereof. In a case where two or more kinds of the hydroxycarboxylic acids are used in combination, a total content thereof is preferably within the range.

In addition, in the present specification, the hydroxycarboxylic acid means a compound having one or more hydroxyl groups and one or more carboxyl groups in one molecule.

Examples of the hydroxycarboxylic acid include citric acid, tartaric acid, glycolic acid, 2-hydroxyisobutyric acid, glyceric acid, L-leucic acid, malic acid, salicylic acid, gluconic acid, and lactic acid, and at least one selected from the group consisting of citric acid, tartaric acid, glycolic acid, 2-hydroxyisobutyric acid, glyceric acid, L-leucic acid, malic acid, salicylic acid, and gluconic acid is preferable.

Among those, from the viewpoint that a treatment liquid having more excellent effects of the present invention can be obtained, a C Log P value of the hydroxycarboxylic acid is preferably 3 or less, more preferably 1 or less, still more preferably −1 or less, and particularly preferred is −1.5 or less. In a case where the C Log P value of the hydroxycarboxylic acid is 1 or less, the treatment liquid has more excellent residue removal performance; in a case where the C Log P value is −1 or less, the treatment liquid has more excellent residue removal performance and more excellent resist removal properties; and in a case where the C Log P value is −1.5 or less, the treatment liquid has more excellent residue removal performance and more excellent resist removal properties.

Examples of the hydroxycarboxylic acid having a C Log P value of −1.5 or less include citric acid, gluconic acid, and glyceric acid.

Moreover, in the present specification, the C Log P value is a value computed by a program "C LOG P" available from Daylight Chemical Information System, Inc. This program provides a value of a "computed log P" calculated by a Hansch, Leo's fragment approach (refer to documents below). The fragment approach is based on the chemical structure of a compound, and divides the chemical structure into partial structures (fragments) and sums the log P contribution allocated to each fragment, whereby a log P value of the compound is estimated. The details thereof are described in the following documents. In the present invention, a C log P value computed by the program C LOG P v 4.82 is used.

A. J. Leo, Comprehensive Medicinal Chemistry, Vol. 4, C. Hansch, P. G Sammnens, J. B. Taylor and C. A. Ramsden, Eds., p. 295, Pergamon Press, 1990 C. Hansch & A. J. Leo. Substituent Constants For Correlation Analysis in Chemistry and Biology. John Wiley & Sons. A. J. Leo. Calculating log Poct from structure. Chem. Rev., 93, 1281-1306, 1993.

The log P refers to the common logarithm of a partition coefficient P, is a value of a physical property which indicates how an organic compound is distributed in an equilibrium of a two-phase system of oil (generally 1-octanol) and water as a quantitative numerical number, and is expressed in the following formula.

$$\log P = \log(C_{oil}/C_{water})$$

In the formula, Coil represents the molar concentration of a compound in the oil phase, and Cwater represents the molar concentration of a compound in the aqueous phase.

A case where the value of log P is increased to a positive value across 0 indicates that the oil solubility increases, a case where the absolute value is increased to a negative value indicates that the water solubility increases, and the log P is negatively correlated with water solubility of the organic compound, and thus widely used as a parameter for estimating the hydrophilicity and the hydrophobicity of the organic compound.

Moreover, the treatment liquid does not substantially contain abrasive particles. The expression, not substantially containing, means that the content of the abrasive particles is a content of 1,000 ppm by mass or less with respect to the total mass of the treatment liquid, and the content is preferably 500 ppm by mass or less, and more preferably 100 ppm by mass.

The abrasive particles are not particularly limited, but examples thereof include particles (such as silicon oxide particles) used in a slurry for chemical mechanical polishing, or the like.

[Other Components]

The treatment liquid may contain other components which are other than those described above. Examples of such other components include a solvent; a hydroxylamine compound; an anticorrosive agent for tungsten; and a chelating agent.

<Solvent>

The treatment liquid preferably contains a solvent. The solvent is not particularly limited, and a known solvent can be used. Examples of the solvent include water, an organic solvent, and a mixture thereof.

A content of the solvent in the treatment liquid is not particularly limited, but is generally preferably 10% to 99% by mass, more preferably 30% to 95% by mass, and still more preferably 60% to 95% by mass, with respect to the total mass of the treatment liquid. The solvent may be used singly or in combination of two or more kinds thereof. In a case where two or more kinds of the solvents are used in combination, a total content thereof is preferably within the range.

(Organic Solvent)

Examples of the organic solvent include a halogenated hydrocarbon-based solvent, an alcohol-based solvent, an ether-based solvent, an ester-based solvent, a ketone-based solvent, a nitrile-based solvent, an amide-based solvent, and a sulfoxide-based solvent.

A content of the organic solvent in the treatment liquid is not particularly limited, but is generally preferably 10% by mass or more, more preferably 30% by mass or more, still more preferably more than 50% by mass, and particularly preferably 60% by mass or more, and is preferably 99% by mass or less, and more preferably 95% by mass or less, with respect to the total mass of the treatment liquid.

In a case where the content of the organic solvent in the treatment liquid is 30% by mass or more, the treatment liquid has more excellent residue removal performance. Further, in a case where the content of the organic solvent in the treatment liquid is more than 50% by mass, the treatment liquid has more excellent residue removal performance and more excellent resist removal performance. Moreover, in a case where the content of the organic solvent in the treatment liquid is 60% by mass or more, the treatment liquid has more excellent residue removal performance. In addition, in a case where the content of the organic solvent in the treatment liquid is 95% by mass or less, the solubility of each component in the treatment liquid is further improved, and the treatment liquid has more excellent residue removal performance.

The organic solvent may be used singly or in combination of two or more kinds thereof. In a case where two or more kinds of the organic solvents are used in combination, a total content thereof is preferably within the range.

Examples of the alcohol-based solvent include methanol, ethanol, 1-propanol, 2-propanol, 2-butanol, ethylene glycol, propylene glycol, glycerin, 1,6-hexanediol, cyclohexanediol, sorbitol, xylitol, 2-methyl-2,4-pentanediol, 3-methoxy-3-methyl-1-butanol, 3-methoxy-1-butanol, 1,3-butanediol, tripropylene glycol, hexylene glycol, and 1,4-butanediol.

Examples of the ether-based solvent include dimethyl ether, diethyl ether, diisopropyl ether, dibutyl ether, t-butyl methyl ether, cyclohexyl methyl ether, anisole, tetrahydrofuran, diethylene glycol, dipropylene glycol, polyethylene glycol, and alkylene glycol alkyl ether (ethylene glycol monomethyl ether, ethylene glycol monobutyl ether, propylene glycol monomethyl ether, diethylene glycol monomethyl ether, triethylene glycol, propylene glycol monomethyl ether, dipropylene glycol monomethyl ether, tripropylene glycol monomethyl ether, diethylene glycol monobutyl ether, tripropylene glycol monomethyl ether, and diethylene glycol monobutyl ether).

Examples of the ester-based solvent include ethyl acetate, ethyl lactate, 2-(1-methoxy)propyl acetate, and propylene glycol monomethyl ether acetate.

Examples of the ketone-based solvent include acetone, methyl ethyl ketone, methyl isobutyl ketone, cyclohexanone, and 2-heptanone.

Examples of the nitrile-based solvent include acetonitrile.

Examples of the amide-based solvent include N,N-dimethylformamide, 1-methyl-2-pyrrolidone, 2-pyrrolidinone, 1,3-dimethyl-2-imidazolidinone, 2-pyrrolidinone, ε-caprolactam, formamide, N-methyl Examples include formamide, acetamide, N-methylacetamide, N,N-dimethylacetamide, N-methylpropanamide, and hexamethylphosphoric triamide.

Examples of the sulfoxide-based solvent include dimethyl sulfoxide.

Among those, from the viewpoint that a treatment liquid having more excellent effects of the present invention can be obtained, as the organic solvent, the alcohol-based solvent, the ether-based solvent, or a mixture thereof is preferable, and a mixture of the alcohol-based solvent and the ether-based solvent is more preferable.

(Water)

The treatment liquid may contain water. A content of water in the treatment liquid is not particularly limited, but is generally preferably 1% to 70% by mass, and more preferably 5% to 20% by mass, with respect to the total mass of the treatment liquid.

<Hydroxylamine Compound>

The treatment liquid may contain a hydroxylamine compound. In the present specification, the hydroxylamine compound means a compound including hydroxylamine, a hydroxylamine derivative, and a salt thereof.

A content of the hydroxylamine compound in the treatment liquid is not particularly limited, but is generally preferably 0.5% to 15% by mass with respect to the total mass of the treatment liquid. The hydroxylamine compound may be used singly or in combination of two or more kinds thereof. In a case where two or more kinds of the hydroxylamine compounds are used in combination, a total content thereof is preferably within the range.

The treatment liquid containing the hydroxylamine compound has more excellent anticorrosion performance (in particular, excellent anticorrosion performance against tungsten) and more excellent residue removal performance.

The hydroxylamine derivative is not particularly limited, but examples thereof include O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxyl amine, O,N,N-trimethylhydroxylamine, N,N-dicarboxyethylhydroxylamine and N,N-disulfoethylhydroxylamine.

Examples of the salt of the hydroxylamine or the hydroxylamine derivative include an inorganic acid salt or an organic acid salt of the hydroxylamine or the hydroxylamine derivative. Examples thereof include hydroxylamine nitrate, hydroxylamine sulfate, hydroxylamine hydrochloride, hydroxylamine phosphate, N,N-diethylhydroxylamine sulfate, and N,N-diethylhydroxylamine nitrate.

<Anticorrosive Agent for Tungsten (W)>

The treatment liquid preferably contains an anticorrosive agent for W. The anticorrosive agent for W is not particularly limited, and a known anticorrosive agent for W can be used.

A content of the anticorrosive agent for W in the treatment liquid is not particularly limited, but is generally preferably 0.005% to 2% by mass with respect to the total mass of the treatment liquid. The anticorrosive agent for W may be used singly or in combination of two or more kinds thereof. In a case where two or more kinds of the anticorrosive agents for W are used in combination, a total content thereof is preferably within the range.

The corrosion inhibitor for W is not particularly limited, but examples thereof include 1,2,4-triazole, 5-aminotetrazole, 5-amino-1,3,4-thiadiazole-2-thiol, 3-amino-1H-1,2,4-triazole, 3,5-diamino-1,2,4-triazole, tolyltriazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyltetrazole, bismuthiol I, 1,3-dimethyl-2-imidazolidinone, 1,5-pentamethylenetetrazole, 1-phenyl-5-mercaptotetrazole, diaminomethyltriazine, imidazolinethione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, amines, pyrazoles, propanethiol, silanes, secondary amines, benzohydroxamic acids, a heterocyclic nitrogen inhibitor, citric acid, ascorbic acid, thiourea, 1,1,3,3-tetramethylurea, urea, urea derivatives, uric acid, potassium ethylxanthate, glycine, dodecylphosphonic acid, iminodiacetic acid, boric acid, malonic acid, succinic acid, nitrilotriacetic acid, sulfolane, 2,3,5-trimethylpyrazine, 2-ethyl-3,5-dimethyl pyrazine, quinoxaline, acetylpyrrole, pyridazine, histadine, pyrazine, (reduced) glutathione, cysteine, cystine, thiophene, mercaptopyridine N-oxide, thiamine HCl, tetraethylthiuram disulfide, 2,5-dimercapto-1,3-thiadiazole ascorbic acid, ascorbic acid, catechol, t-butyl catechol, phenol, and pyrogallol. Among those, a compound having a triazole skeleton is preferable as the anticorrosive agent for W from the viewpoint that a treatment liquid having more excellent effects of the present invention can be obtained.

Examples of the compound having a triazole skeleton include 1,2,4-triazole, 3-amino-1H-1,2,4 triazole, 3,5-diamino-1,2,4-triazole, tolyltriazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, and naphthotriazole.

Furthermore, a hydrophilic polymer can also be used as the anticorrosive agent for W. Examples of the hydrophilic polymer include polyglycols such as polyethylene glycol; alkyl ethers of polyglycols; polysaccharides such as polyvinyl alcohol; polyvinyl alcohol A; polyvinylpyrrolidone; polysaccharides such as alginic acid; carboxylic acid-containing polymers such as polymethacrylic acid and polyacrylic acid; polyacrylamide; polymethacrylamide; and polyethylenimine. Specific examples of such a hydrophilic polymer include the compounds described in paragraphs 0042 to 0044 of JP2009-088243A and paragraph 0026 of JP2007-194261A, the contents of which are hereby incorporated by reference.

The hydrophilic polymer is preferably at least one selected from the group consisting of polyacrylamide, polymethacrylamide, polyethylenimine, and polyvinylpyrrolidone. As the polyacrylamide and the polymethacrylamide, those having a hydroxyalkyl group on a nitrogen atom (for example, an N-(2-hydroxyethyl)acrylamide polymer) or those having a substituent having a polyalkyleneoxy chain are preferable, and the weight-average molecular weight is more preferably 2,000 to 50,000. As the polyethylenimine, a polyethylenimine having a polyalkyleneoxy chain on a nitrogen atom is preferable, and a polyethylenimine having a repeating unit represented by the following general formula are more preferable.

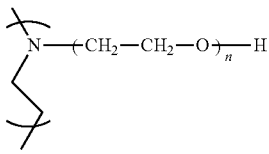

In the formula, n represents a number of 2 to 200 (in a case of a mixture, n is an average number thereof).

Furthermore, it is preferable to use a polyethylenimine having an HLB (hydrophile-lipophile balance) value of 16 to 19.

Moreover, an amino acid can also be used as the anticorrosive agent for W. The amino acid is not particularly limited, and a known amino acid can be used. Examples of the amino acid include glycine, α-alanine, β-alanine, N-methylglycine, L-2-aminobutyric acid, L-norvaline, L-valine, L-leucine or a derivative thereof, L-proline, L-ornithine, L-lysine, taurine, L-serine, L-threonine, L-allothreonine, L-homoserine, L-tyrosine, L-thyroxine, 4-hydroxy-L-proline, L-cysteine, L-methionine, L-ethionine, L-cystine or a derivative thereof, L-cysteic acid, L-aspartic acid, L-glutamic acid, 4-aminobutyric acid, L-asparagine, L-glutamine, azaserine, L-arginine, L-canavanine, L-citrulline, δ-hydroxy-L-lysine, creatine, L-kynurenine, L-histidine or a derivative thereof, and L-tryptophan.

Moreover, a guanidine compound can also be used as the anticorrosive agent for W. The guanidine compound is not particularly limited, but examples thereof include tetramethylguanidine.

(Chelating Agent)

The treatment liquid may contain a chelating agent. The chelating agent is not particularly limited, and a known chelating agent can be used. A content of the chelating agent in the treatment liquid is not particularly limited, but is generally preferably 0.01% to 5% by mass with respect to the total mass of the treatment liquid. The chelating agent may be used singly or in combination of two or more kinds thereof. In a case where two or more kinds of the chelating agents are used in combination, a total content thereof is preferably within the range.

Examples of the chelating agent include a polyaminopolycarboxylic acid.

The polyaminopolycarboxylic acid is a compound having a plurality of amino groups and a plurality of carboxylic acid groups, and examples thereof include a monoalkylenepolyamine polycarboxylic acid, a polyalkylenepolyamine polycarboxylic acid, a polyaminoalkane polycarboxylic acid, a polyaminoalkanol polycarboxylic acid, and a hydroxyalkyl ether polyamine polycarboxylic acid.

Examples of the polyaminopolycarboxylic acid chelating agent include butylenediaminetetraacetic acid, di ethylenetriaminepentaacetic acid (DTPA), ethylenediaminetetrapropionic acid, tri ethylenetetraaminehexaacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid, ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanetetraacetic acid, 1,4,7,10-tetraazacyclododecane-tetraacetic acid, diaminopropanoltetraacetic acid, and (hydroxyethyl)ethylenediaminetriacetic acid.

<Other Additives>

The treatment liquid may contain other additives as long as the effects of the present invention are exhibited. Examples of such other additives include a surfactant, an anti-foaming agent, and a pH adjuster.

[pH of Treatment Liquid]

The pH of the treatment liquid is not particularly limited, but is generally preferably 7 to 14, more preferably 7.5 to 14, and still more preferably 8 to 12.

In a case where the pH is 7.5 to 14, the treatment liquid has more excellent residue removal performance.

In addition, in the present specification, the pH of the treatment liquid means a pH measured by a glass electrode method with adjustment of the liquid temperature of the treatment liquid to 23° C.

The pH adjuster is not particularly limited, and a known one can be used. Examples of the pH adjuster include imines (for example, 1,8-diazabicyclo[5.4.0]undecane-7-ene, 1,5-diazabicyclo[4.3.0]non-5-ene), and 1,4-diazabicyclo[2.2.2]octane. The pH adjuster may be used singly or in combination of two or more kinds thereof.

A blending amount of the pH adjuster is not particularly limited as long as a desired pH of the treatment liquid can be achieved, but is generally contained in the treatment liquid at a concentration of preferably 0.1% to 5% by mass, and more preferably 0.1% to 2% by mass, with respect to the total mass of the treatment liquid.

[Electrical Conductivity of Treatment Liquid]

An electrical conductivity of the treatment liquid is not particularly limited, but is generally preferably 10 to 15,000 mS/cm, more preferably 50 to 10,000 mS/cm, and still more preferably 300 to 3,000 mS/cm. In a case where the electrical conductivity is 50 mS/cm or more, the treatment liquid has more excellent anticorrosion performance against various members (in particular, anticorrosion performance against tungsten). In a case where the electrical conductivity is 10,000 mS/cm or less, the treatment liquid has more excellent anticorrosion performance against various members (in particular, anticorrosion performance against tungsten) and more excellent resist removal properties.

In addition, in the present specification, the electrical conductivity of the treatment liquid means a value obtained by measurement with an electrical conductivity meter after adjusting the liquid temperature of the treatment liquid to 25° C.

The electrical conductivity can be controlled by, for example, adjusting a content of a conductive substance (for example, a metal component) or the like contained in the treatment liquid. The metal component contained in the treatment liquid is not particularly limited, but examples thereof include ions and/or particles of Fe, Zn, Pb, Al, Ni, and the like. Further, a method for adjusting the content of the conductive substance contained in the treatment liquid is not particularly limited, but examples thereof include a method of adjusting a type of a filter used in a filtering step and a method of adjusting filtering and recovering, with regard to a method for producing a treatment liquid described below.

In addition, the metal component may be added to the treatment liquid or may have been incorporated into the treatment liquid from a production device (a tank, a piping, and the like) in the step of producing the treatment liquid.

Treatment Liquid (Second Embodiment)

A treatment liquid according to a second embodiment of the present invention is a treatment liquid containing at least one polyacid compound selected from the group consisting of an isopolyacid and a heteropolyacid, and an alkali compound, in which abrasive particles are not substantially contained. Hereinafter, the components and the like of the treatment liquid will be described, but in a case where the components of the treatment liquid and the physical properties of the treatment liquid are the same as those of the treatment liquid according to the first embodiment, a description thereof will be omitted.

[Polyacid Compound]

The treatment liquid contains a polyacid compound. The polyacid compound is not particularly limited, and a known polyacid compound can be used. A content of the polyacid compound in the treatment liquid is not particularly limited, but is generally preferably 0.01 ppm by mass or more, more preferably 0.05 ppm by mass or more, and still more preferably 0.1 ppm by mass or more, and is preferably 5% by mass or less, more preferably 0.05% by mass or less, and still more preferably 0.01% by mass or less, with respect to the total mass of the treatment liquid. The polyacid compound may be used singly or in combination of two or more kinds thereof. In a case where two or more kinds of the polyacid compounds are used in combination, a total content thereof is preferably within the range.

In addition, in the present specification, the polyacid compound means a compound containing an isopolyacid and a salt thereof, and a heteropolyacid and a salt thereof.

Examples of the isopolyacid include molybdic acid and tungstic acid.

Examples of the heteropolyacid include borotungstic acid, silicotungstic acid, cobalttungstic acid, aluminotungstic acid, galliumtungstic acid, phosphotungstic acid, phosphomolybdic acid, germanotungstic acid, and vanadomolybdophosphoric acid.

In addition, the salt is not particularly limited, but examples thereof include an alkali metal salt and an alkaline earth metal salt.

[Applications of Treatment Liquid]

The treatment liquid is preferably used for manufacture of a semiconductor substrate. The treatment liquid can be used in any step for manufacturing the semiconductor substrate, and can also be used, for example, for a treatment of an insulating film, a resist, an etching residue, an antireflection film, and an ashing residue, and the like, which exist on the substrate.

Among those, at least one selected from the group consisting of an etching liquid and a washing liquid is preferable.

More specific examples of the application of the treatment liquid include a pre-wet liquid to be coated on a substrate to improve the coatability of a composition for forming a resist film before a step of forming a resist film using the composition of forming a resist film, a washing liquid used for removal of residues such as etching residues, or the like, a solution (for example, a removing liquid and a peeling liquid) used for removal of various resist films for forming a pattern, and a solution (for example, a removing liquid and a peeling liquid) used for removal of a permanent film (for example, a color filter, a transparent insulating film, and a resin-made lens) from a semiconductor substrate. In addition, the treatment liquid can also be used as a developer for various resists for forming a pattern. Further, since the semiconductor substrate after the removal of the permanent film is sometimes used again for a use of a semiconductor device, the removal of the permanent film is included in a step of manufacturing the semiconductor device.

The treatment liquid of the embodiment of the present invention may be used in only one application or two or more applications of the applications.

In recent years, as miniaturization and high functionalization of semiconductor devices proceed, metals used for wiring materials, plug materials, or the like are required to be more conductive. For example, it is presumed that substitution of aluminum (Al) and copper (Cu) in the metals used as the wiring materials with cobalt (Co) proceeds. In addition, with regard to metals used as the plug materials, it is expected that a demand for Co in addition to tungsten (W) will further increase.

Therefore, as characteristics of the treatment liquid, the corrosion to W and Co is required to be small, and particularly, the corrosion to Co is required to be small.

Since the treatment liquid has excellent corrosion inhibitory properties against W and Co, and excellent removal performance against residues (a resist residue, a residue after dry etching, and the like) at the same time, it is preferably used as a treatment liquid for a semiconductor substrate having a layer containing Co or W.

[Method for Producing Treatment Liquid]

A method for producing the treatment liquid is not particularly limited, and the components described above may be mixed. In addition, from the viewpoint that a treatment liquid having more excellent effects of the present invention can be obtained, with regard to the treatment liquid (of the first embodiment), it is preferable that the method for producing a treatment liquid has a filtering step in which an object to be purified, containing an alkali compound and a hydroxycarboxylic acid, is filtered using a filter to obtain a treatment liquid. Furthermore, with regard to the treatment liquid (of the second embodiment), it is preferable that the method for producing a treatment liquid has a filtering step in which an object to be purified, containing an alkali compound and a polyacid compound, is filtered using a filter to obtain a treatment liquid.

The following description is common in the treatment liquid according to the first embodiment and the method for producing a treatment liquid according to the second embodiment.

<Filtering Step>

The method for producing a treatment liquid according to the embodiment of the present invention includes a filtering step in which an object to be purified is filtered using a filter to obtain a treatment liquid. A method for filtering the object to be purified using the filter is not particularly limited, but is preferable a method in which an object to be purified is passed through (subjected to liquid passage through) a filter unit having a housing and a cartridge filter housed in the housing with or without pressurization.

Pore Diameter of Filter

A pore diameter of the filter is not particularly limited, and a filter having a pore diameter which is usually used for filtering an object to be purified can be used. The pore diameter of the filter is preferably 200 nm or less, more preferably 20 nm or less, still more preferably 10 nm or less, particularly preferably 5 nm or less, and most preferably 3 nm or less. A lower limit value thereof is not particularly limited, but is generally preferably 1 nm or more from the viewpoint of productivity.

Moreover, in the present specification, the pore diameter and the pore diameter distribution of the filter mean a pore diameter and a pore diameter distribution, respectively, as determined by a bubble point of isopropanol (IPA) or HFE-7200 ("Novec 7200", manufactured by 3M, hydrofluoroether, $C_4F_9OC_2H_5$).

In a case where the pore diameter of the filter is 5.0 nm or less, a chemical liquid has more excellent defect suppression performance. Hereinafter, the filter having a pore diameter of 5.0 nm or less is also referred to as a "micropore diameter filter".

Furthermore, the micropore diameter filter may be used singly or in combination with another filter having a different pore diameter. Above all, it is preferable to use the filter in combination with a filter having a larger pore diameter from the viewpoint of more excellent productivity. In this case, by passing an object to be purified, which has been filtered through a filter having a larger pore diameter in advance, through a micropore diameter filter, it is possible to prevent the micropore diameter filter from clogging.

That is, with regard to the pore diameter of a filter, in a case where one filter is used, the pore diameter is preferably 5.0 nm or less, and in a case where two or more filters are used, the pore diameter of the filter having the smallest pore diameter is preferably 5.0 nm or less.

A form in which two or more kinds of filters having different pore diameters are sequentially used is not particularly limited, but examples thereof include a method of sequentially arranging the above-described filter units in a pipe line through which an object to be purified is transported. In this case, in a case where an attempt is made to make the flow rate of the object to be purified per unit time constant in the entire pipe line, a larger pressure may be applied to a filter unit which is smaller than the pore diameter in some cases, as compared with a filter unit which is larger than the pore diameter. In this case, it is preferable to make the pressure applied to the filter unit having a small pore diameter constant by arranging a pressure regulation valve, a damper, and the like between the filter units, or to increase a filtration area by, for example, arranging filter units having the same filter housed therein in parallel to the pipe line.

Materials for Filter

A material for the filter is not particularly limited, and a known one can be used as the material for the filter. Specifically, in a case where the material is a resin, examples of the material include polyamides such as 6-nylon and 6,6-nylon; polyolefins such as polyethylene and polypropylene; polystyrenes; polyimides; polyamideimides; poly (meth)acrylates; polyfluorocarbons such as polytetrafluoroethylene, perfluoroalkoxyalkane, a perfluoroethylene propene copolymer, an ethylene tetrafluoroethylene copolymer, an ethylene chlorotrifluoroethylene copolymer, polychlorotrifluoroethylene, polyvinylidene fluoride, and polyvinyl fluoride; polyvinyl alcohols; polyesters; cellulose; and cellulose acetate. Among those, at least one selected from the group consisting of the nylons (among those, 6,6-nylon is preferable) and the polyolefins (among those, polyethylene is preferable), the poly(meth)acrylate, and the polyfluorocarbons (among those, polytetrafluoroethylene (PTFE) and perfluoroalkoxyalkane (PFA) are preferable) is preferable from the viewpoint that a treatment liquid thus obtained has more excellent defect suppression performance due to its more excellent solvent resistance. These polymers can be used singly or in combination of two or more kinds thereof.

Furthermore, in addition to the resin, diatomaceous earth, glass, or the like may be used.

Moreover, the filter may be a surface-treated filter. A method for the surface treatment is not particularly limited, and a known method can be used. Examples of the method for the surface treatment include chemical modification treatment, plasma treatment, hydrophobic treatment, coating, gas treatment, and sintering.

The plasma treatment is preferable since the surface of the filter is hydrophilized. A water contact angle on the surface of the filter which has been hydrophilized by the plasma treatment is not particularly limited, but a static contact angle at 25° C. measured by a contact angle meter is preferably 60° or less, more preferably 50° or less, and still more preferably 30° or less.

As the chemical modification treatment, a method of introducing an ion exchange group into a base material of a filter is preferable.

That is, a filter in which each of the above-mentioned materials is used as a base material and an ion exchange group is introduced into the base material is preferable as the filter. Typically, a filter including a layer including a base material having an ion exchange group on the surface of the base material is preferable. The surface-modified base material is not particularly limited, and a filter in which an ion exchange group is introduced into the polymer is preferable from the viewpoint that it is easily produced.

Examples of the ion exchange group include a cation exchange group such as a sulfonic acid group, a carboxyl group, and a phosphoric acid group, and examples of the anion exchange group include secondary, tertiary, and quaternary ammonium groups. A method for introducing the ion exchange group into a polymer is not particularly limited, and examples thereof include a method in which a compound having an ion exchange group and a polymerizable group is reacted with a polymer and typically grafted.

The method for introducing the ion exchange group is not particularly limited, but active portions (radicals) are generated in the resin by irradiating the fibers of the resin with ionizing radiation (α-rays, β-rays, γ-rays, X-rays, electron beams, and the like). The resin after the irradiation is immersed in a monomer-containing solution to graft-polymerize the monomers onto the base material. As a result, a product in which this monomer is bonded to the resin fiber as a graft polymerization side chain is produced. By contacting the resin having the generated monomer as a side chain with a compound having an anion exchange group or a cation exchange group, an ion exchange group can be introduced into the graft-polymerized monomer in the side chain to obtain a final product.

Furthermore, the filter may be configured such that a woven fabric or a nonwoven fabric having an ion exchange group formed by a radiation graft polymerization method is combined with a glass wool, a woven fabric, or a nonwoven fabric.

In a case where a filter having an ion exchange group is used, it is easy to control a content of particles containing a metal atom in the treatment liquid in a desired range. A material for the filter having an ion exchange group is not particularly limited, but examples thereof include a filter in which an ion exchange group is introduced into a polyfluorocarbon or a polyolefin, and the filter in which an ion exchange group is introduced into a polyfluorocarbon is more preferable.

A pore diameter of the filter having an ion exchange group is not particularly limited, but is preferably 1 to 30 nm, and more preferably 5 to 20 nm. The filter having an ion exchange group may also serve as the filter having the smallest pore diameter described above, or may be used separately from the filter having the smallest pore diameter. Above all, it is preferable that the filtering step is in a form in which a filter having an ion exchange group and a filter having no ion exchange group and having the smallest pore diameter are used in combination, from the viewpoint that a treatment liquid having more excellent effects of the present invention can be obtained.

A material for the filter having the smallest pore diameter described above is not particularly limited, but from the viewpoint of solvent resistance and the like, generally, at least one selected from the group consisting of a polyfluorocarbon and a polyolefin is preferable, and the polyolefin is more preferable.

Moreover, in a case where the material for the filter is the polyamide (in particular, a nylon), it is possible to easily control the contents of a high-boiling point organic compound and particles in which a metal atom and the high-boiling point organic compound are associated in the treatment liquid.

Therefore, as the filter used in the filtering step, two or more filters having different materials are preferably used, and two or more selected from the group consisting of a polyolefin, a polyfluorocarbon, a polyamide, and those having an ion exchange group introduced thereinto are more preferably used.

Pore Structure of Filter

The pore structure of the filter is not particularly limited, and may be appropriately selected according to the components in the object to be purified. In the present specification, the pore structure of the filter means a pore diameter distribution, a positional distribution of pores in a filter, a shape of a pore, or the like, and can be typically controlled by a method for manufacturing a filter.

For example, in a case where a powder of a resin or the like is sintered, a porous membrane can be obtained, and in a case where a method such as electrospinning, electroblowing, and meltblowing is used to form the filter, a fiber membrane can be obtained. These have each different pore structures.

A "porous membrane" means a membrane which retains components in an object to be purified, such as gels, particles, colloids, cells, and poly-oligomers, but allows components substantially smaller than the pores to pass through the pores. The retention of the components in the object to be purified by the porous membrane sometimes depends on operating conditions, such as a surface velocity, a use of a surfactant, a pH, and a combination thereof, and can depend on the pore diameter and the structure of the porous membrane, and the size and the structure (hard particles, gels, or the like) of the particles to be removed.

The pore structure of the porous membrane (for example, a porous membrane including UPE, PTFE, or the like) is not particularly limited, but examples of the pore shape include a lace shape, a string shape, and a node shape.

The pore size distribution in the porous membrane and the position distribution in the membrane are not particularly limited. The size distribution may be smaller and the distribution position in the membrane may be symmetric. In addition, the size distribution may be larger and the distribution position in the membrane may be asymmetric (the membrane is also referred to as an "asymmetric porous membrane"). In the asymmetric porous membrane, the size of the pores varies throughout the membrane, and typically, the pore diameter increases from one surface of the membrane to the other surface of the membrane. In this case, the surface on the side with many pores having large pore diameters is referred to as an "open side", and the surface on the side with many pores with small pore diameters is also referred to as a "tight side".

In addition, examples of the asymmetric porous membrane include a membrane in which the size of a pore is minimized at a position within the thickness of the membrane (this is also referred to as an "hourglass shape").

In a case where the porous membrane is used to make a pore having a larger size on the primary side hole, and in other words, in a case where the primary side serves as the open side, a pre-filtration effect can be caused.

The porous membrane may include thermoplastic polymers such as polyethersulfone (PESU), perfluoroalkoxyalkane (PFA, a copolymer of tetrafluoroethylene and perfluoroalkoxyalkane), a polyamide, and a polyolefin, and may also include polytetrafluoroethylene.

Among those, an ultrahigh-molecular-weight polyethylene is preferable as the material for the porous membrane. The ultrahigh-molecular-weight polyethylene means a thermoplastic polyethylene having an extremely long chain, and preferably has a molecular weight of 1,000,000 or more, and typically 2,000,000 to 6,000,000.

In a case where the object to be purified contains particles containing a high-boiling point organic compound as impurities (which may be in the form of a gel), the particles containing the high-boiling point organic compound are often negatively charged, and thus, a filter made of a polyamide fulfils the function of a non-sieving membrane to remove such particles. Typical examples of the non-sieving membranes include, but not limited to, nylon membranes such as a nylon-6 membrane and a nylon-6,6 membrane.

In addition, a retention mechanism with "non-sieving" as used in the present specification refers to retention caused by a pressure reduction of the filter, or a mechanism such as interference, diffusion, and adsorption, which is not related to the pore diameter.

The non-sieving retention includes retention mechanisms such as interference, diffusion, and adsorption, which remove particles to be removed from an object to be purified, regardless of the pressure reduction of the filter or the pore diameter of the filter. The adsorption of particles onto the filter surface can be mediated by, for example, an intermolecular van der Waals force or electrostatic force. An interfering effect occurs in a case where particles traveling in a non-sieving membrane layer having a tortuous path cannot change the direction quickly enough to avoid a contact with the non-sieving membrane. The particle transport by diffusion creates a constant probability that the particles collide with a filter media, and results primarily from a random motion or a Brownian motion of small particles. In a case where there is no a repulsive force between the particles and the filter, the non-sieving retention mechanism can be active.

The ultrahigh-molecular-weight polyethylene (UPE) filter is typically a sieving membrane. The sieving membrane means a membrane which mainly captures particles via a sieving retention mechanism or a membrane which is optimized for capturing particles via a sieving retention mechanism.

Typical examples of the sieving membrane include, but not limited to, a polytetrafluoroethylene (PTFE) membrane and a UPE membrane.

Furthermore, the "sieving retention mechanism" refers to retaining the results due to removal of particles to be removed which are larger than the pore diameter of the porous membrane. A sieving retention force can be improved by forming a filter cake (aggregation of particles to be removed on the surface of the membrane). The filter cake effectively fulfils the function of a secondary filter.

A material for the fiber membrane is not particularly limited as long as it is a polymer capable of forming the fiber membrane. Examples of the polymer include a polyamide. Examples of the polyamide include nylon 6 and nylon 6,6. The polymer forming the fiber membrane may be poly(ether sulfone). In a case where the fiber membrane is on the primary side of a porous membrane, it is preferable that the surface energy of the fiber membrane is higher than that of a polymer which is a material of the porous membrane on the secondary side. An example of such a combination is a case where the material of the fiber membrane is nylon and the porous membrane is polyethylene (UPE).

A method for producing the fiber membrane is not particularly limited, and a known method can be used. Examples of the method for producing the fiber membrane include electrospinning, electroblowing, and meltblowing.

As a filter used in the filtering step, two or more filters having different pore structures are preferably used, and filters of a porous membrane and a fiber membrane filter are preferably included. Specifically, it is preferable to use a filter of a nylon fiber membrane and a filter of a UPE porous membrane in combination.

As described above, in the filtering step according to the embodiment of the present invention, a multi-stage filtering step in which at least one selected from the group consisting of a material for a filter, a pore diameter, and a pore structure allows an object to be purified to pass through two or more kinds of different filters is preferable.

(Multi-Stage Filtering Step)

The multi-stage filtering step can be carried out using a known purification device. FIG. 1 is a schematic view showing a typical example of a purification device capable of carrying out a multi-stage filtering step. A purification device 10 has a production tank 11, a filtering apparatus 16, and a filling apparatus 13, and the respective units are connected by a pipe line 14.

The filtering apparatus 16 has filter units 12(a) and 12(b) connected by the pipe line 14. A regulation valve 15(a) is arranged in the pipe line between the filter units 12(a) and 12(b).

In FIG. 1, an object to be purified is stored in the production tank 11. Next, a pump, not shown in the drawing, arranged in the pipe line 14 is operated, and the object to be purified is sent from the production tank 11 to the filtering apparatus 16 via the pipe line 14. The transfer direction of the object to be purified in the purification device 10 is indicated by $F_1$ in FIG. 1.

The filtering apparatus 16 consists of the filter units 12(a) and 12(b) connected by the pipe line 14, and each of the two filter units houses a filter cartridge having a filter which is different in at least one selected from the group consisting of a pore diameter, a material, and a pore structure. The filtering apparatus 16 has a function of filtering an object to be purified supplied through the pipe line with a filter.

The filter housed in each filter unit is not particularly limited, but the filter having the smallest pore diameter is preferably housed in the filter unit 12(b).

By operating a pump, the object to be purified is supplied to the filter unit 12(a) and filtered. The object to be purified filtered by the filter unit 12(a) is subjected to pressure reduction with the regulation valve 15(a), as necessary, and supplied to the filter unit 12(b) and filtered.

Moreover, the purification device may not have the regulation valve 15(a). Further, even in a case where the regulation valve 15(a) is included, its position may be on the primary side of the filter unit 12(a).

In addition, as an apparatus capable of regulating the supply pressure of the object to be purified, an apparatus other than the regulation valve may be used. Examples of such a member include a damper.

Furthermore, in the filtering apparatus 16, each filter forms a filter cartridge, but the filter which can be used in the purification method according to the present embodiment is not limited to the form. For example, a form in which the object to be purified is passed through a filter formed in a planar shape may also be used.

Moreover, the purification device 10 is configured such that the object to be purified after passing through the filter unit 12(b) and being filtered is transferred to a filling apparatus 13 and stored in a container, but the filtering apparatus for carrying out the purification method is not limited to the above ones, and a configuration where the object to be purified after passing through the filter unit 12(b) and being filtered is returned to the production tank 11, and a liquid is allowed to pass through the filter unit 12(a) and the filter unit 12(b) again may also be available. The filtration method as described above is referred to circulation filtration. In the purification of an object to be purified by circulating filtration, at least one of two or more kinds of filters is used twice or more. In the present specification, an operation in which the object to be purified, which has been filtered by each filter unit, is returned to the production tank again is counted as one circulation. In addition, the number of circulations may be appropriately selected according to components and the like in the object to be purified.

A material for a liquid contact part (which means an inner wall surface or the like with which the object to be purified and the treatment liquid may come into contact) of the purification device is not particularly limited, but is preferably formed of at least one selected from the group consisting of a non-metal material and an electropolished metal material (hereinafter also collectively referred to as a "corrosion-resistant material"). For example, examples of the case where the liquid contact part of the production tank consists of a corrosion-resistant material include a case where the production tank itself consists of a corrosion-resistant material, or a case where the inner wall surface and the like of the production tank are coated with the corrosion-resistant material.

The non-metal material is not particularly limited, and a known material can be used.

Examples of the non-metal material include, but not limited to, at least one selected from the group consisting of a polyethylene resin, a polypropylene resin, a polyethylene/ polypropylene resin, a tetrafluoroethylene resin, a tetrafluoroethylene/perfluoroalkyl vinyl ether copolymer, a tetrafluoroethylene/hexafluoropropylene copolymer resin, an tetrafluoroethylene/ethylene copolymer resin, a chlorotrifluoroethylene/ethylene copolymer resin, a vinylidene fluoride resin, a chlorotrifluoroethylene copolymer resin, and a vinyl fluoride resin.

The metal material is not particularly limited, and a known material can be used.

Examples of the metal material include a metal material in which a total content of Cr and Ni is more than 25% by mass with respect to a total mass of the metal material, and among those, the total content is more preferably 30% by mass or more. The upper limit value of the total content of Cr and Ni in the metal material is not particularly limited, but is generally preferably 90% by mass or less.

Examples of the metal material include stainless steel and an Ni—Cr alloy.

The stainless steel is not particularly limited, and a known stainless steel can be used. Among those, an alloy containing 8% by mass or more of Ni is preferable, and an austenitic stainless steel containing 8% by mass or more of Ni is more preferable. Examples of the austenitic stainless steel include steel use stainless (SUS) 304 (an Ni content of 8% by mass, a Cr content of 18% by mass), SUS 304L (an Ni content of 9% by mass, a Cr content of 18% by mass), SUS 316 (an Ni content of 10% by mass, a Cr content of 16% by mass), and SUS 316L (an Ni content of 12% by mass, a Cr content of 16% by mass).

The Ni—Cr alloy is not particularly limited, and a known Ni—Cr alloy can be used. Among those, an NiCr alloy having an Ni content of 40% to 75% by mass and a Cr content of 1% to 30% by mass is preferable.

Examples of the Ni—Cr alloy include a Hastelloy (trade name, the same applies hereinafter), Monel (trade name, the same applies hereinafter), and Inconel (trade name, the same applies hereinafter). More specific examples thereof include Hastelloy C-276 (an Ni content of 63% by mass, a Cr content of 16% by mass), Hastelloy-C (an Ni content of 60% by mass, a Cr content of 17% by mass), and Hastelloy C-22 (an Ni content of 61% by mass, a Cr content of 22% by mass).

In addition, the Ni—Cr alloy may further contain B, Si, W, Mo, Cu, Co, or the like, as necessary, in addition to the above-mentioned alloys.

A method for electropolishing the metal material is not particularly limited, and a known method can be used. For example, the methods described in paragraphs 0011 to 0014 of JP2015-227501A, paragraphs 0036 to 0042 of JP2008-264929A, or the like can be used.

It is presumed that the metal material has a larger content of Cr in a passivation layer on the surface than the content of Cr in a parent phase by electropolishing the metal material. As a result, it is presumed that it is difficult for metal impurities containing a metal atom to flow into the object to be purified in a case of using a purification device in which the liquid contact part is formed of an electropolished metal material.

Furthermore, the metal material may be buffed. The buffing method is not particularly limited, and a known method can be used. The size of the abrasive grains used to finish the buffing is not particularly limited, but is preferably #400 or less from the viewpoint that the unevenness of the surface of the metal material is more likely to be smaller. Incidentally, buffing is preferably performed before the electropolishing.

<Other Steps>

The method for producing a treatment liquid according to the embodiment of the present invention is not particularly limited as long as it has the filtering step, and may further have steps other than the filtering step. Examples of the steps other than the filtering step include an electricity removing step.

(Electricity Removing Step)

The electricity removing step is a step of reducing a charged potential of the object to be purified by removing electricity.

The electricity removing method is not particularly limited, and a known electricity removing method can be used. Examples of the electricity removing method include a method of contacting an object to be purified with a conductive material.

A contact time for contacting the object to be purified with the conductive material is preferably 0.001 to 60 seconds, more preferably 0.001 to 1 second, and still more preferably 0.01 to 0.1 seconds. Examples of the conductive material include stainless steel, gold, platinum, diamond, and glassy carbon.

Examples of a method of bringing the object to be purified into contact with the conductive material include a method of arranging a grounded mesh consisting of a conductive material within a pipe line and passing the object to be purified therethrough.

With regard to the purification of the treatment liquid, it is preferable that opening of the container, washing of the container and the apparatus, storage of the solution, analysis, and the like are all performed in a clean room. It is preferable that the clean room satisfies 14644-1 clean room standards. It is preferable that the clean room satisfies any one of International Organization for Standardization (ISO) Class 1, ISO Class 2, ISO Class 3, or ISO Class 4, it is more preferable that the clean room satisfies ISO Class 1 or ISO Class 2, and it is still more preferable that the clean room satisfies ISO Class 1.

The storage temperature of the treatment liquid is not particularly limited, but from the viewpoint that impurities and the like contained in a trace amount in the treatment liquid are more difficult to elute, and as a result, more excellent effects of the present invention can be obtained, the storage temperature is preferably 4° C. or higher.

[Treatment Liquid Housing Body]

The treatment liquid produced by the purification method may be stored in a container and stored until use. Such the container and the treatment liquid (or a resist composition) stored in the container are collectively referred to as a treatment liquid housing body. The treatment liquid is taken out from the stored treatment liquid housing body and used.

As a container which stores the treatment liquid, a container having a high degree of cleanliness and less elution of impurities, used in applications for manufacturing a semiconductor device, is preferable.

Specific examples of the usable containers include, but not limited to, "CLEAN BOTTLE" series manufactured by Aicello Chemical Co., Ltd. and "PURE BOTTLE" manufactured by Kodama Plastics Co., Ltd.

It is also preferable to use a multilayer bottle having a 6-layer structure with an inner wall formed from six kinds of resins or a multilayer bottle having a 7-layer structure formed from 6 kinds of resins as a container for the purpose of preventing incorporation (contamination) of impurities into the treatment liquid. Examples of such containers include those described in JP2015-123351A.

The liquid contact part of this container preferably consists of the above-described corrosion-resistant material or glass. It is preferable that 90% or more of the area of the liquid contact part is consisting of the material, and it is more preferable that all of the liquid contact part is consisting of the material from the viewpoint that more excellent effects of the present invention are obtained.

[Treatment Method]

The method for treating a laminate according to the embodiment of the present invention is a treatment method for treating a laminate having a substrate and at least one layer selected from the group consisting of a resist layer and a metal-containing layer, arranged on the substrate, the method including at least one step selected from the group consisting of a step of removing at least one layer selected from the group consisting of the resist layer and the metal-containing layer on the substrate using the above-mentioned treatment liquid, a step of removing a residue derived from at least one layer selected from the group consisting of the resist layer and the metal-containing layer on the substrate using the treatment liquid.

<Laminate>

The laminate has (1) a substrate and (2) at least one layer selected from the group consisting of a resist layer and a metal-containing layer, arranged on the substrate.

The substrate is not particularly limited, and may have a single-layer configuration or a multilayer configuration.

In a case of the single-layer configuration, the material is not particularly limited, but is generally preferably constituted of Groups III to V compounds such as Si, SiGe, and GaAs, or any of combinations thereof.

In a case of the multilayer configuration, the material and the layer configuration are not particularly limited, and may have, for example, an exposed integrated circuit structure such as interconnect features such as metal lines and dielectric materials on a layer such as the above-mentioned silicon. Examples of the metal and the alloy used for the interconnect structure include, but not limited to, Al, a Cu—Al alloy, Cu, Ti, Ta, Co, Si, TiN, TaN, and W. In addition, it may have an interlayer dielectric layer, a layer of $SiO_2$, SiN, SiOC, and SiC.

The laminate has at least one selected from the group consisting of the resist layer and the metal-containing layer, arranged on the substrate.

The resist film is not particularly limited, and a known resist film can be used.

The metal-containing layer is not particularly limited, but preferably contains at least one metal selected from the group consisting of Ti, Hf, Ta, and Zr. More specifically, it is more preferable that the metal-containing layer includes at least one component selected from the group consisting of Ta, a Ta alloy, TiAl, Ti, TiN, TiOx, ZrOx, HfOx, and TaOx. Here, x and y are preferably numbers represented by x=1 to 3 and y=1 or 2, respectively. In addition, the metal-containing layer may be a metal hard mask.

The laminate may have another layer other than the above layers. Examples of such other layers include a metal layer, an interlayer insulating layer, and an etching stop layer.

It is preferable that the laminate further has, as the metal layer, a layer containing at least one selected from the group consisting of Co, W, and Cu. Among those, it is more preferable that the laminate has a layer containing Co or W.

Furthermore, Co, W, and Cu may be alloyed with other metals.

The metal layer may further include metals other than Co, W, and Cu, metals, or alloys. Specific examples thereof include Ti, Ti—W, TiN, Ta, a Ta compound, Cr, Cr oxide, and Al. In addition, the metal layer is a layer containing a metal different from the metal-containing layer, and the metal layer may be a wiring layer.

A material for the interlayer insulating film is not particularly limited, and examples thereof include those having a dielectric constant k of preferably 3.0 or less, and more preferably 2.6 or less.

Specific examples of the material for the interlayer insulating film include organic polymers such as $SiO_x$, SiN, SiOC, and a polyimide. In addition, x is preferably a number represented by 1 to 3.

A material for the etching stop layer is not particularly limited. Specific examples of the material for the etching stop layer include SiN—, SiON—, and SiOCN-based materials, and metal oxides such as AlOx.

Furthermore, the laminate may further have a layer containing Al, $AlO_X$ (X is a number from 1 to 3), and AlN.

The method for treating the laminate has at least one selected from the group consisting of a step of removing at least one layer selected from the group consisting of the resist layer and the metal-containing layer on the substrate using a treatment liquid (peeling step), and a step of removing a residue derived from at least one layer selected from the group consisting of the resist layer and the metal-containing layer on the substrate using the above-described treatment liquid (residue removing step).

The treatment method is not particularly limited, but examples thereof include a method in which a washing liquid is brought into contact with each of objects to be treated.

A method for bringing the treatment liquid into contact with an object to be treated is not particularly limited, but examples thereof include a method in which an object to be treated is immersed in a treatment liquid charged in a tank, a method in which a treatment liquid is sprayed onto an object to be washed, a method in which a treatment liquid is flown onto an object to be washed, and a combination thereof. From the viewpoint of residue removal properties, the method in which an object to be washed is immersed in a treatment liquid is preferable.

A temperature for the treatment liquid during the treatment is not particularly limited, but is preferably 20° C. to 90° C., more preferably 23° C. to 75° C., and still more preferably 40° C. to 65° C.

In a case where the temperature of the treatment liquid during the treatment is 23° C. to 75° C., more excellent washing properties (residue removal performance) can be obtained by washing a wafer using the treatment liquid.

The treatment time can be adjusted according to the treatment method used and the temperature of the treatment liquid.

In a case where the treatment is performed by an immersion batch method (a batch method in which a plurality of objects are immersed and treated in a treatment tank), the treatment time is, for example, 60 minutes or less, preferably 1 to 60 minutes, more preferably 3 to 20 minutes, and still more preferably 4 to 15 minutes.

In a case where the treatment is performed by a single-wafer method, the treatment time is, for example, 10 seconds to 5 minutes, preferably 15 seconds to 4 minutes, more preferably 15 seconds to 3 minutes, and still more preferably 20 seconds to 2 minutes.

In addition, in order to further enhance the capacity of the treatment liquid, a mechanical stirring method may be used.

Examples of the mechanical stirring method include a method of circulating a treatment liquid on an object, a method of flowing or spraying a treatment liquid on an object, and a method of stirring a treatment liquid with an ultrasonic or a megasonic.

Moreover, in a case where the substrate has a layer containing at least one selected from the group consisting of Co, Al, AlO$_x$, and AlN, and x is a number of 1 to 3, the etching removal rate of the layer before and after the treatment is not particularly limited, but is preferably 5.0 nm or less, and more preferably 3.0 nm (30 angstroms) or less.

In addition, in the present specification, the etching removal rate means a decreased amount of the film thickness per minute in a case where a layer formed by a predetermined method is brought into contact with a treatment liquid, and specifically, the etching removal rate is an amount which can be measured by the method described as an "etching rate" in Examples.

EXAMPLES

Hereinbelow, the present invention will be described in more detail with reference to Examples. The materials, the amounts used, the proportions, the treatment details, the treatment procedure, and the like shown in Examples below may be modified as appropriate as long as the modifications do not depart from the spirit of the present invention. Therefore, the scope of the present invention should not be construed as being limited to Examples shown below.

Furthermore, in the manufacture of treatment liquid housing bodies of Examples and Comparative Examples, all of handling of a container, and preparation, filling, storage, and analytical measurement of the treatment liquids were performed in a clean room satisfying a level of ISO Class 2 or lower. In order to enhance the measurement accuracy, in the measurement of the content of the organic impurities and the measurement of the content of the metal component, measurements at a detection limit or less for common measurements were performed after concentration to $\frac{1}{100}$ in terms of a volume and the contents were calculated in terms of the concentration of the treatment liquid before concentrating.

The containers used in Examples were sufficiently washed with the following ultrapure water and/or a solvent to be stored before use.

The water used in Examples was purified by the method described in JP2007-254168A and used for adjusting the treatment liquid.

Example 1

The following respective components were mixed to obtain a mixture. Next, the mixture was sequentially filtered (multi-stage filtration) with the following filter, subjected to preparation using methanesulfonic acid/diazabicycloundecene (MSA/DBU) to adjust the pH to 14, and used as a treatment liquid.

[Components (Descriptions in Parentheses Indicate the Meanings of the Abbreviations in Table 1)]
TMAH (tetramethylammonium hydroxide): 5% by mass
Molybdic acid: 0.01% by mass
DEGBE (diethylene glycol monobutyl ether): 60% by mass
HG (hexylene glycol): 10% by mass
Water: Balance
[Filter Configuration]
Filtration was performed once using an HDPE-made filter having a particle diameter of 15 nm and UPE in 5 nm.

Examples 2 to 77 and Comparative Examples 1 to 5

The treatment liquids of Examples 2 to 77 and Comparative Examples 1 to 5 were prepared by mixing the respective components described in Table 1 by the same method as in Example 1. Specifically, the respective components described in Table 1 were first mixed to obtain a mixture. Next, the mixture was subjected to multi-stage filtration by the same method as in Example 1 and adjusted with MSA/DBU so that the pH reached the value shown in Table 1, thereby obtaining a treatment liquid.

Each of abbreviations in Table 1 indicates the following contents.
TBAH (tetrabutylammonium hydroxide)
TEAH (tetraethylammonium hydroxide)
TPAH (tetrapropylammonium hydroxide)
HA (hydroxylamine)
HAS (hydroxylamine sulfate)
PG (propylene glycol)
DPG (dipropylene glycol)
TPG (tripropylene glycol)
TPGME (tripropylene glycol monomethyl ether)
DMSO (dimethyl sulfoxide)
PEI (polyethylenimine)
PAA (polyacrylic acid)
PAS (diallyldimethylammonium chloride polymer)
[Measurement of Electrical Conductivity]
The electrical conductivity of the treatment liquid was measured using an electrical conductivity meter. The measurement conditions are as follows.
Temperature of treatment liquid at the time of measurement 23° C.
Conductivity meter (electrical conductivity meter) manufactured by HORIBA Ltd.: Portable type D-70/ES-70 series was used.
[Evaluation 1: Anticorrosion Performance]
A laminate having a film having a thickness of 1,000 angstroms (1 angstrom represents 0.1 nm) and consisting of Co (hereinafter also referred to as a "Co film") was prepared on a silicon wafer having a diameter of about 300 mm.

This laminate was immersed in the treatment liquids of Examples and Comparative Examples for 10 minutes, and the etching rate (angstrom/min) was calculated based on a difference in the thickness of the Co film before and after the immersion.

Furthermore, the thickness of the Co film before and after the treatment was measured using an ellipsometer (spectroscopic ellipsometer, trade name "Vase", manufactured by J.A. Woollam Co., Inc.) under the conditions of a measurement range of 250 to 1,000 nm and measurement angles of 70 degrees and 75 degrees.

In addition, the smaller etching rate indicates the more excellent anticorrosion performance against the Co film. That is, as the numerical value is smaller, the anticorrosion performance of the treatment liquid is more excellent.

Moreover, a laminate having a film consisting of W (hereinafter also referred to as a "W film") on a silicon wafer and a laminate having a film consisting of AlOx (hereinafter also referred to as an "AlOx film") on a silicon wafer were prepared, and the etching rate was measured in the same manner as above. The measurement results are shown in Table 1. The smaller etching rate indicates the more excellent anticorrosion performance against the W film and the AlOx film. That is, as the numerical value is smaller, the chemical liquid has more excellent anticorrosion performance. "ER" in Table 1 represents an etching rate.

[Evaluation 2: Residue Removal Performance]

A laminate having a film having a thickness of 1,000 angstroms (1 Å represents 0.1 nm) and consisting of TiO$_2$, was prepared on a silicon wafer having a diameter of 300 mm.

This laminate was immersed in the treatment liquids of Examples and Comparative Examples for 5 minutes, and the etching rate (angstrom/min) was calculated based on a difference in the thickness of the TiO$_2$ film before and after the immersion.

Furthermore, the thickness of the TiO$_2$ film before and after the treatment was measured using an ellipsometer (spectroscopic ellipsometer, "MS-2000", manufactured by J.A. Woollam Co., Inc.) under the conditions of a measurement range of 250 to 1,000 nm and measurement angles of 70 degrees and 75 degrees.

In addition, TiO$_2$ is one of the components of the residue generated in a case where a metal hard mask used in the manufacture of a semiconductor substrate was subjected to plasma etching, and the higher etching rate for TiO$_2$ indicates that the treatment liquid has more excellent residue removal performance. The results were evaluated according to the following standard and are shown in Table 1.

A The etching rate was 10 Å/min or more.
B The etching rate was 5 Å/min or more and less than 10 Å/min.
C The etching rate was 3 Å/min or more and less than 5 Å/min.
D The etching rate was less than 3 Å/min.

[Evaluation 3: Resist Removal Performance]

A resist composition containing the following respective components was applied onto a silicon wafer having a diameter of 300 mm to manufacture a silicon wafer having a resist composition layer (a substrate with a resist composition layer). This substrate with a resist composition layer was heated and then exposed to form a resist film having a thickness of 100 nm, thereby obtaining a substrate with the resist film.

Next, the substrate with the resist film was immersed in the treatment liquid described in each of Examples and Comparative Examples for 5 minutes, and a decreased amount of the film thickness per unit time (nm/min) was measured based on a difference in the thickness of the resist film before and after the immersion. The results are shown in Table 1.

The larger decreased amount of the film thickness per unit time indicates more excellent resist removal performance. That is, as the numerical value is larger, the treatment liquid has more excellent resist film removal performance (resist removal performance). The results were evaluated according to the following standard and are shown in Table 1.

A The decreased amount of the film thickness was 50 nm/min or more.
B The decreased amount of the film thickness was 20 nm/min or more and less than 50 nm/min.
C The decreased amount of the film thickness was 10 nm/min or more and less than 20 nm/min.
D The decreased amount of the film thickness was less than 10 nm/min.

[Preparation of Actinic Ray-Sensitive or Radiation-Sensitive Resin Composition]

An actinic ray-sensitive or radiation-sensitive resin (resist) composition was prepared by the following method. Further, the resist composition was prepared by mixing the respective components and then filtering the mixture through a filter having a pore diameter of 0.03 μm. Hereinafter, the actinic ray-sensitive or radiation-sensitive resin composition will be described.

<Resist Composition>

Acid-decomposable resin (resin represented by the following Formula (weight-average molecular weight (Mw): 7,500): the numerical value described in each repeating unit means % by mole): 100 parts by mass

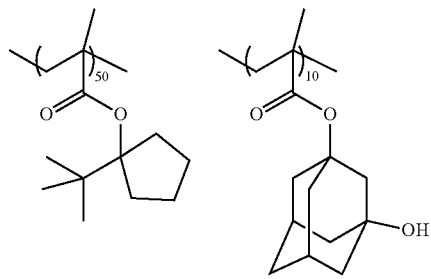

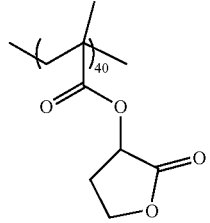

Photoacid generator shown below: 8 parts by mass

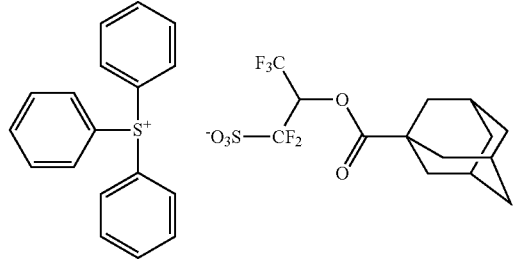

Quencher shown below: 5 parts by mass (the mass ratio was 0.1:0.3:0.3:0.2 in order from the left). In addition, among the following quenchers, those of the polymer type have a weight-average molecular weight (Mw) of 5,000. The numerical value described in each repeating unit means a molar ratio.

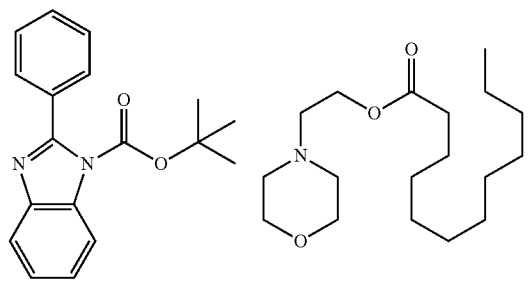

-continued

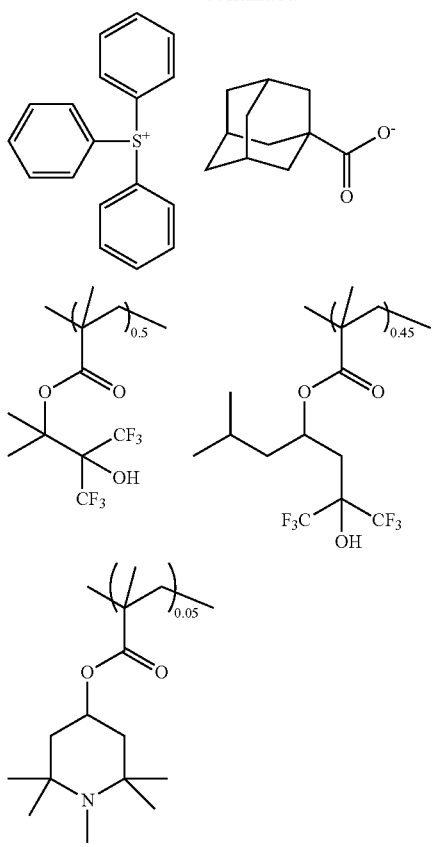

Hydrophobic resin shown below: 4 parts by mass (the mass ratio was 0.5:0.5 in order from the left), and in the following hydrophobic resins, the hydrophobic resin on the left side has a weight-average molecular weight (Mw) of 7,000 and the hydrophobic resin on the right side has a weight-average molecular weight (Mw) of 8,000. In addition, in each hydrophobic resin, the numerical value described in each repeating unit means a molar ratio.

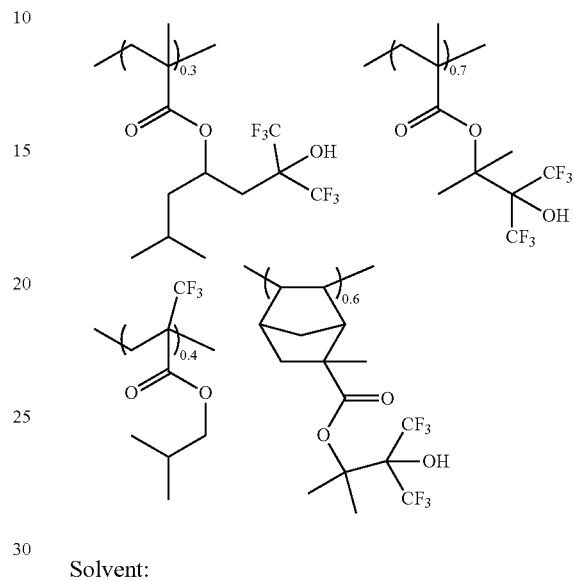

Solvent:
PGMEA (propylene glycol monomethyl ether acetate): 3 parts by mass
CyHx (cyclohexanone): 600 parts by mass
GBL (γ-butyrolactone): 100 parts by mass

TABLE 1

| 1-1 of Table 1 | Alkali compound (A) | | Polyacid compound (B) | | Hydroxycarboxylic acid (C) | | |
|---|---|---|---|---|---|---|---|
| | Type | Content (% by mass) | Type | Content (% by mass) | Type | Content (% by mass) | ClogP |
| Example 1 | TMAH | 5 | Molybdic acid | 0.01 | | | |
| Example 2 | TEAH | 5 | Molybdic acid | 0.01 | | | |
| Example 3 | TMAH | 5 | Silicon molybdate | 0.01 | | | |
| Example 4 | TMAH | 5 | | | Citric acid | 0.5 | −1.72 |
| Example 5 | TMAH | 5 | | | Tartaric acid | 0.5 | −1.43 |
| Example 6 | TMAH | 5 | | | Citric acid | 0.5 | −1.72 |
| Example 7 | TMAH | 5 | Molybdic acid | 0.01 | | | |
| Example 8 | TMAH | 5 | | | Citric acid | 0.5 | −1.72 |
| Example 9 | TMAH | 5 | | | Citric acid | 0.5 | −1.72 |
| Example 10 | TMAH | 5 | | | Citric acid | 0.5 | −1.72 |
| Example 11 | TMAH | 5 | | | Citric acid | 0.5 | −1.72 |
| Example 12 | TMAH | 5 | | | Citric acid | 0.5 | −1.72 |
| Example 13 | TMAH | 5 | | | Citric acid | 0.5 | −1.72 |
| Example 14 | TMAH | 5 | | | Citric acid | 0.5 | −1.72 |
| Example 15 | TMAH | 5 | | | Glycolic acid | 0.5 | −1.05 |
| Example 16 | TMAH | 5 | | | Tartaric acid | 0.5 | −1.43 |
| Example 17 | TMAH | 5 | | | 2-Hydroxy-isobutyric acid | 0.5 | −1.14 |
| Example 18 | TMAH | 5 | | | Glyceric acid | 0.5 | −1.92 |
| Example 19 | TMAH | 5 | | | L-Leucic acid | 0.5 | 0.71 |
| Example 20 | TMAH | 5 | | | Malic acid | 0.5 | −1.26 |
| Example 21 | TMAH | 5 | | | Salicylic acid | 0.5 | 2.06 |
| Example 22 | TMAH | 5 | | | Gluconic acid | 0.5 | −3.17 |
| Example 23 | TMAH | 5 | Silicon molybdate | 0.01 | | | |
| Example 24 | TMAH | 5 | Phosphomolybdic acid | 0.01 | | | |
| Example 25 | TMAH | 5 | Tungstic acid | 0.01 | | | |
| Example 26 | TMAH | 2.5 | | | Citric acid | 0.5 | −1.72 |
| Example 27 | TMAH | 1 | | | Citric acid | 0.5 | −1.72 |
| Example 28 | TMAH | 10 | | | Citric acid | 0.5 | −1.72 |
| Example 29 | TMAH | 5 | | | Citric acid | 0.5 | −1.72 |
| Example 30 | TMAH | 5 | | | Citric acid | 0.5 | −1.72 |

TABLE 1-continued

| 1-1 of Table 1 | Alkali compound (A) | | Polyacid compound (B) | | Hydroxycarboxylic acid (C) | | ClogP |
|---|---|---|---|---|---|---|---|
| | Type | Content (% by mass) | Type | Content (% by mass) | Type | Content (% by mass) | |
| Example 31 | TMAH | 5 | | | Citric acid | 0.5 | −1.72 |
| Example 32 | TMAH | 5 | | | Citric acid | 0.5 | −1.72 |
| Example 33 | TMAH | 5 | Silicon molybdate | 0.00001 | | | |

TABLE 2

| 1-2 of Table 1 | Hydroxylamine Derivative (D) | | Organic solvent 1 | | Organic solvent 2 | | Anticorrosive agent against W | |
|---|---|---|---|---|---|---|---|---|
| | Type | Content (% by mass) | Type | Content (% by mass) | Type | Content (% by mass) | Type | Content (% by mass) |
| Example 1 | | | DEGBE | 60 | HG | 10 | | |
| Example 2 | | | DEGBE | 60 | HG | 10 | | |
| Example 3 | | | DEGBE | 60 | HG | 10 | | |
| Example 4 | | | DEGBE | 60 | HG | 10 | | |
| Example 5 | | | DEGBE | 60 | HG | 10 | | |
| Example 6 | | | DEGBE | 60 | HG | 10 | | |
| Example 7 | HA | 10 | DEGBE | 60 | HG | 10 | | |
| Example 8 | HA | 10 | DEGBE | 60 | HG | 10 | | |
| Example 9 | HA | 10 | DEGBE | 60 | HG | 10 | | |
| Example 10 | HA | 10 | DEGBE | 60 | HG | 10 | | |
| Example 11 | HA | 10 | DEGBE | 60 | HG | 10 | | |
| Example 12 | HA | 10 | DEGBE | 60 | HG | 10 | | |
| Example 13 | HA | 10 | DEGBE | 60 | HG | 10 | | |
| Example 14 | HA | 10 | DEGBE | 60 | HG | 10 | | |
| Example 15 | HA | 10 | DEGBE | 60 | HG | 10 | | |
| Example 16 | HA | 10 | DEGBE | 60 | HG | 10 | | |
| Example 17 | HA | 10 | DEGBE | 60 | HG | 10 | | |
| Example 18 | HA | 10 | DEGBE | 60 | HG | 10 | | |
| Example 19 | HA | 10 | DEGBE | 60 | HG | 10 | | |
| Example 20 | HA | 10 | DEGBE | 60 | HG | 10 | | |
| Example 21 | HA | 10 | DEGBE | 60 | HG | 10 | | |
| Example 22 | HA | 10 | DEGBE | 60 | HG | 10 | | |
| Example 23 | HA | 10 | DEGBE | 60 | HG | 10 | | |
| Example 24 | HA | 10 | DEGBE | 60 | HG | 10 | | |
| Example 25 | HA | 10 | DEGBE | 60 | HG | 10 | | |
| Example 26 | HA | 10 | DEGBE | 60 | HG | 10 | | |
| Example 27 | HA | 10 | DEGBE | 60 | HG | 10 | | |
| Example 28 | HA | 10 | DEGBE | 60 | HG | 10 | | |
| Example 29 | HA | 5 | DEGBE | 60 | HG | 10 | | |
| Example 30 | HA | 1 | DEGBE | 60 | HG | 10 | | |
| Example 31 | HA | 0.8 | DEGBE | 60 | HG | 10 | | |
| Example 32 | HA | 12 | DEGBE | 60 | HG | 10 | | |
| Example 33 | HA | 10 | DEGBE | 60 | HG | 10 | | |

TABLE 3

| 1-3 of Table 1 | pH | Water (% by mass) | Electrical conductivity (mS/cm) | Content mass ratio | | | |
|---|---|---|---|---|---|---|---|
| | | | | B/A | C/A | B/D | C/D |
| Example 1 | 14 | Balance | 352 | 0.002 | | | |
| Example 2 | 14 | Balance | 349 | 0.002 | | | |
| Example 3 | 14 | Balance | 338 | 0.002 | | | |
| Example 4 | 14 | Balance | 452 | | 0.1 | | |
| Example 5 | 14 | Balance | 408 | | 0.1 | | |
| Example 6 | 8 | Balance | 462 | | 0.1 | | |
| Example 7 | 8 | Balance | 952 | 0.002 | | 0.001 | |
| Example 8 | 8 | Balance | 938 | | 0.1 | | 0.05 |
| Example 9 | 8.5 | Balance | 1,432 | | 0.1 | | 0.05 |
| Example 10 | 9 | Balance | 1,532 | | 0.1 | | 0.05 |
| Example 11 | 9.5 | Balance | 1,589 | | 0.1 | | 0.05 |
| Example 12 | 10 | Balance | 1,625 | | 0.1 | | 0.05 |
| Example 13 | 11 | Balance | 1,854 | | 0.1 | | 0.05 |

TABLE 3-continued

| 1-3 of Table 1 | pH | Water (% by mass) | Electrical conductivity (mS/cm) | Content mass ratio B/A | C/A | B/D | C/D |
|---|---|---|---|---|---|---|---|
| Example 14 | 7 | Balance | 1,874 | | 0.1 | | 0.05 |
| Example 15 | 8 | Balance | 1,296 | | 0.1 | | 0.05 |
| Example 16 | 8 | Balance | 1,365 | | 0.1 | | 0.05 |
| Example 17 | 8 | Balance | 1,254 | | 0.1 | | 0.05 |
| Example 18 | 8 | Balance | 1,459 | | 0.1 | | 0.05 |
| Example 19 | 8 | Balance | 1,326 | | 0.1 | | 0.05 |
| Example 20 | 8 | Balance | 1,456 | | 0.1 | | 0.05 |
| Example 21 | 8 | Balance | 1,356 | | 0.1 | | 0.05 |
| Example 22 | 8 | Balance | 1,311 | | 0.1 | | 0.05 |
| Example 23 | 8 | Balance | 1,168 | 0.002 | | 0.001 | |
| Example 24 | 8 | Balance | 1,245 | 0.002 | | 0.001 | |
| Example 25 | 8 | Balance | 1,198 | 0.002 | | 0.001 | |
| Example 26 | 8 | Balance | 856 | | 0.2 | | 0.05 |
| Example 27 | 8 | Balance | 942 | | 0.5 | | 0.05 |
| Example 28 | 8 | Balance | 945 | | 0.05 | | 0.05 |
| Example 29 | 8 | Balance | 958 | | 0.1 | | 0.1 |
| Example 30 | 8 | Balance | 785 | | 0.1 | | 0.5 |
| Example 31 | 8 | Balance | 712 | | 0.1 | | 0.625 |
| Example 32 | 8 | Balance | 2,152 | | 0.1 | | 0.042 |
| Example 33 | 8 | Balance | 985 | 0.000002 | | 0.000001 | |

TABLE 4

| 1-4 of Table 1 | Evaluation items | | | | |
|---|---|---|---|---|---|
| | Co ER | AlOx ER | W ER | Resist removal performance | Residue removal performance |
| Example 1 | 10 | 16 | >25 | A | C |
| Example 2 | 8 | 14 | >25 | A | C |
| Example 3 | 9 | 12 | >25 | A | C |
| Example 4 | 6 | 8 | >25 | A | C |
| Example 5 | 5 | 9 | >25 | A | C |
| Example 6 | 12 | 11 | 18 | C | C |
| Example 7 | 14 | 13 | 22 | B | A |
| Example 8 | 13 | 12 | 20 | B | A |
| Example 9 | 10 | 14 | 21 | B | A |
| Example 10 | 9 | 15 | 24 | B | A |
| Example 11 | 7 | 18 | >25 | B | A |
| Example 12 | 6 | 20 | >25 | A | A |
| Example 13 | 5 | >25 | >25 | A | A |
| Example 14 | 16 | 9 | 16 | C | C |
| Example 15 | 12 | 6 | 22 | B | B |
| Example 16 | 13 | 7 | 21 | B | B |
| Example 17 | 17 | 11 | 23 | B | B |
| Example 18 | 11 | 8 | 21 | B | A |
| Example 19 | 18 | 12 | 22 | C | B |
| Example 20 | 12 | 8 | 24 | B | B |
| Example 21 | 17 | 7 | 19 | C | C |
| Example 22 | 13 | 6 | 20 | B | A |
| Example 23 | 19 | 12 | 23 | B | A |
| Example 24 | 15 | 11 | 24 | B | A |
| Example 25 | 16 | 10 | 21 | B | A |
| Example 26 | 7 | 15 | >25 | B | A |
| Example 27 | 5 | 11 | >25 | B | A |
| Example 28 | 15 | 4 | 9 | B | A |
| Example 29 | 8 | 12 | 8 | B | A |
| Example 30 | 6 | 8 | 5 | C | B |
| Example 31 | 4 | 9 | 3 | C | C |
| Example 32 | 14 | 15 | 21 | A | A |
| Example 33 | 16 | 14 | 22 | B | A |

TABLE 5

| 2-1 of Table 1 | Alkali compound (A) | | Polyacid compound (B) | | Hydroxycarboxylic acid (C) | | |
|---|---|---|---|---|---|---|---|
| | Type | Content (% by mass) | Type | Content (% by mass) | Type | Content (% by mass) | ClogP |
| Example 34 | TMAH | 5 | Silicon molybdate | 0.0001 | | | |
| Example 35 | TMAH | 5 | | | Citric acid | 0.05 | −1.72 |
| Example 36 | TMAH | 5 | | | Citric acid | 0.005 | −1.72 |
| Example 37 | TMAH | 5 | | | Citric acid | 5 | −1.72 |
| Example 38 | TMAH | 5 | | | Citric acid | 0.5 | −1.72 |
| Example 39 | TMAH | 5 | | | Citric acid | 0.5 | −1.72 |
| Example 40 | TBAH | 5 | | | Citric acid | 0.5 | −1.72 |
| Example 41 | TMAH | 5 | | | Citric acid | 0.5 | −1.72 |
| Example 42 | TMAH | 5 | | | Citric acid | 0.5 | −1.72 |
| Example 43 | TEAH | 5 | | | Citric acid | 0.5 | −1.72 |
| Example 44 | TMAH | 5 | | | Citric acid | 0.5 | −1.72 |
| Example 45 | TMAH | 5 | | | Citric acid | 0.5 | −1.72 |
| Example 46 | TMAH | 5 | | | Citric acid | 0.5 | −1.72 |
| Example 47 | TMAH | 5 | | | Citric acid | 0.5 | −1.72 |
| Example 48 | TMAH | 5 | | | Citric acid | 0.5 | −1.72 |

TABLE 5-continued

|  | Alkali compound (A) | | Polyacid compound (B) | | Hydroxycarboxylic acid (C) | | |
|---|---|---|---|---|---|---|---|
| 2-1 of Table 1 | Type | Content (% by mass) | Type | Content (% by mass) | Type | Content (% by mass) | ClogP |
| Example 49 | TMAH | 5 |  |  | Citric acid | 0.5 | −1.72 |
| Example 50 | TMAH | 5 |  |  | Citric acid | 0.5 | −1.72 |
| Example 51 | TMAH | 5 |  |  | Citric acid | 0.5 | −1.72 |
| Example 52 | TMAH | 5 |  |  | Citric acid | 0.5 | −1.72 |
| Example 53 | TMAH | 5 |  |  | Citric acid | 0.5 | −1.72 |
| Example 54 | TMAH | 5 |  |  | Citric acid | 0.5 | −1.72 |
| Example 55 | TMAH | 5 |  |  | Citric acid | 0.5 | −1.72 |
| Example 56 | TMAH | 5 |  |  | Citric acid | 0.5 | −1.72 |
| Example 57 | TMAH | 5 |  |  | Citric acid | 0.5 | −1.72 |
| Example 58 | TMAH | 5 |  |  | Citric acid | 0.5 | −1.72 |
| Example 59 | TMAH | 5 |  |  | Citric acid | 0.5 | −1.72 |
| Example 60 | TMAH | 5 |  |  | Citric acid | 0.5 | −1.72 |
| Example 61 | TMAH | 5 |  |  | Citric acid | 0.5 | −1.72 |
| Example 62 | TMAH | 5 |  |  | Citric acid | 0.5 | −1.72 |
| Example 63 | TMAH | 5 |  |  | Citric acid | 0.5 | −1.72 |
| Example 64 | TMAH | 5 |  |  | Citric acid | 0.5 | −1.72 |

TABLE 6

|  | Hydroxylamine Derivative (D) | | Organic solvent 1 | | Organic solvent 2 | | Anticorrosive agent against W | | |
|---|---|---|---|---|---|---|---|---|---|
| 2-2 of Table 1 | Type | Content (% by mass) | Type | Content (% by mass) | Type | Content (% by mass) | Type | Content (% by mass) | pH adjuster |
| Example 34 | HA | 10 | DEGBE | 60 | HG | 10 |  |  | MSA/DBU |
| Example 35 | HA | 10 | DEGBE | 60 | HG | 10 |  |  | MSA/DBU |
| Example 36 | HA | 10 | DEGBE | 60 | HG | 10 |  |  | MSA/DBU |
| Example 37 | HA | 10 | DEGBE | 60 | HG | 10 |  |  | MSA/DBU |
| Example 38 | HAS | 2.5 | DEGBE | 60 | HG | 10 |  |  | MSA/DBU |
| Example 39 | HA | 10 | DEGBE | 60 | HG | 10 |  |  | MSA/DBU |
| Example 40 | HA | 10 | DEGBE | 60 | HG | 10 |  |  | MSA/DBU |
| Example 41 | HA | 10 | PG | 70 |  |  |  |  | MSA/DBU |
| Example 42 | HA | 10 | DPG | 70 |  |  |  |  | MSA/DBU |
| Example 43 | HA | 10 | DEGBE | 60 | HG | 10 |  |  | MSA/DBU |
| Example 44 | HA | 10 | DEGBE | 60 | HG | 10 | L-Arginine | 1 | MSA/DBU |
| Example 45 | HA | 10 | DEGBE | 60 | HG | 10 | PEI (MW 500) | 0.01 | MSA/DBU |
| Example 46 | HA | 10 | DEGBE | 60 | HG | 10 | PEI (MW 3,000) | 0.01 | MSA/DBU |
| Example 47 | HA | 10 | DEGBE | 60 | HG | 10 | PEI (MW 3,000) | 0.5 | MSA/DBU |
| Example 48 | HA | 10 | DEGBE | 60 | HG | 10 | PEI (MW 20,000) | 0.01 | MSA/DBU |
| Example 49 | HA | 10 | DEGBE | 60 | HG | 10 | Polyamine sulfonic acid (MW 3,000) | 0.01 | MSA/DBU |
| Example 50 | HA | 10 | DEGBE | 60 | HG | 10 | 3-Amino-1,2,4-triazole | 1 | MSA/DBU |
| Example 51 | HA | 10 | DEGBE | 60 | HG | 10 | 3,5-Diamino-1,2,4-triazole | 1 | MSA/DBU |
| Example 52 | HA | 10 | DEGBE | 60 | HG | 10 | PAA (MW 3,000) | 0.5 | MSA/DBU |
| Example 53 | HA | 10 | DEGBE | 60 | HG | 10 | PAS (MW 3,000) | 0.5 | MSA/DBU |
| Example 54 | HA | 10 | DEGBE | 60 | HG | 10 | PEI (MW 3,000) | 0.5 | MSA/DBU |
| Example 55 | HA | 10 | DEGBE | 60 | HG | 10 | PAA (MW 3,000) | 0.5 | MSA/DBU |
| Example 56 | HA | 10 | DEGBE | 60 | HG | 10 | PAS (MW 3,000) | 0.5 | MSA/DBU |
| Example 57 | HA | 10 | DEGBE | 20 | HG | 5 | PEI (MW 3,000) | 0.01 | MSA/DBU |
| Example 58 | HA | 10 | DEGEE | 30 | HG | 5 | PEI (MW 3,000) | 0.01 | MSA/DBU |
| Example 59 | HA | 10 | DEGBE | 50 | HG | 5 | PEI (MW 3,000) | 0.01 | MSA/DBU |
| Example 60 | HA | 10 | DEGBE | 70 | HG | 5 | PEI (MW 3,000) | 0.01 | MSA/DBU |
| Example 61 | HA | 10 | DEGBE | 70 |  |  | PEI (MW 3,000) | 0.01 | MSA/DBU |
| Example 62 | HA | 10 | 3-Methoxy-3-methyl-1-butanol | 70 |  |  | PEI (MW 3,000) | 0.01 | MSA/DBU |
| Example 63 | HA | 10 | 3-Metboxy-1-butanol | 70 |  |  | PEI (MW 3,000) | 0.01 | MSA/DBU |
| Example 64 | HA | 10 | TPG | 70 |  |  | PEI (MW 3,000) | 0.01 | MSA/DBU |

TABLE 7

| 2-3 of Table 1 | pH | Water (% by mass) | Electrical conductivity (mS/cm) | Content mass ratio B/A | C/A | B/D | C/D |
|---|---|---|---|---|---|---|---|
| Example 34 | 8 | Balance | 921 | 0.00002 | | 0.00001 | |
| Example 35 | 8 | Balance | 785 | | 0.01 | | 0.005 |
| Example 36 | 8 | Balance | 712 | | 0.001 | | 0.0005 |
| Example 37 | 8 | Balance | 4,952 | | 1 | | 0.5 |
| Example 38 | 8 | Balance | 1,023 | | 0.1 | | 0.2 |
| Example 39 | 8 | Balance | 1,159 | | 0.1 | | 0.05 |
| Example 40 | 8 | Balance | 1,456 | | 0.1 | | 0.05 |
| Example 41 | 8 | Balance | 1,892 | | 0.1 | | 0.05 |
| Example 42 | 8 | Balance | 1,811 | | 0.1 | | 0.05 |
| Example 43 | 8 | Balance | 1,352 | | 0.1 | | 0.05 |
| Example 44 | 8 | Balance | 1,452 | | 0.1 | | 0.05 |
| Example 45 | 8 | Balance | 1,852 | | 0.1 | | 0.05 |
| Example 46 | 8 | Balance | 1,652 | | 0.1 | | 0.05 |
| Example 47 | 8 | Balance | 1,752 | | 0.1 | | 0.05 |
| Example 48 | 8 | Balance | 1,874 | | 0.1 | | 0.05 |
| Example 49 | 8 | Balance | 1,965 | | 0.1 | | 0.05 |
| Example 50 | 8 | Balance | 1,752 | | 0.1 | | 0.05 |
| Example 51 | 8 | Balance | 1,892 | | 0.1 | | 0.05 |
| Example 52 | 8 | Balance | 1,785 | | 0.1 | | 0.05 |
| Example 53 | 8 | Balance | 1,911 | | 0.1 | | 0.05 |
| Example 54 | 12 | Balance | 2,011 | | 0.1 | | 0.05 |
| Example 55 | 12 | Balance | 2,036 | | 0.1 | | 0.05 |
| Example 56 | 12 | Balance | 2,147 | | 0.1 | | 0.05 |
| Example 57 | 8 | Balance | 2,689 | | 0.1 | | 0.05 |
| Example 58 | 8 | Balance | 2,456 | | 0.1 | | 0.05 |
| Example 59 | 8 | Balance | 2,013 | | 0.1 | | 0.05 |
| Example 60 | 8 | Balance | 1,983 | | 0.1 | | 0.05 |
| Example 61 | 8 | Balance | 1,852 | | 0.1 | | 0.05 |
| Example 62 | 8 | Balance | 1,952 | | 0.1 | | 0.05 |
| Example 63 | 8 | Balance | 1,785 | | 0.1 | | 0.05 |
| Example 64 | 8 | Balance | 1,952 | | 0.1 | | 0.05 |

TABLE 8

| 2-4 of Table 1 | Co ER | AlOx ER | W ER | Resist removal performance | Residue removal performance |
|---|---|---|---|---|---|
| Example 34 | 2 | 3 | 25 | B | A |
| Example 35 | 1 | 2 | 24 | B | A |
| Example 36 | 13 | 12 | 24 | B | A |
| Example 37 | 3 | 4 | 21 | B | A |
| Example 38 | 5 | 9 | 7 | C | B |
| Example 39 | 16 | 18 | >25 | B | A |
| Example 40 | 15 | 16 | >25 | B | A |
| Example 41 | 3 | 4 | 17 | A | A |
| Example 42 | 6 | 5 | 20 | A | A |
| Example 43 | 12 | 9 | 18 | B | A |
| Example 44 | 8 | 4 | 10 | B | A |
| Example 45 | 9 | 5 | 12 | B | A |
| Example 46 | 7 | 3 | 8 | B | A |
| Example 47 | 7 | 3 | 7 | B | A |
| Example 48 | 5 | 1 | 3 | B | A |
| Example 49 | 6 | 2 | 5 | B | A |
| Example 50 | 8 | 4 | 10 | B | A |
| Example 51 | 8 | 4 | 9 | B | A |
| Example 52 | 4 | 1 | 2 | B | A |
| Example 53 | 5 | 2 | 4 | B | A |
| Example 54 | 7 | 3 | 8 | A | A |
| Example 55 | 7 | 3 | 7 | A | B |
| Example 56 | 6 | 2 | 6 | A | B |
| Example 57 | 12 | 7 | 18 | C | C |
| Example 58 | 8 | 6 | 15 | C | B |
| Example 59 | 4 | 4 | 4 | A | B |
| Example 60 | 2 | 2 | 2 | A | A |
| Example 61 | 6 | 2 | 6 | B | A |
| Example 62 | 6 | 2 | 5 | B | A |
| Example 63 | 7 | 3 | 7 | B | A |
| Example 64 | 5 | 2 | 4 | B | A |

TABLE 9

| 3-1 of Table 1 | Alkali compound (A) Type | Content (% by mass) | Polyacid compound (B) Type | Content (% by mass) | Hydroxycarboxylic acid (C) Type | Content (% by mass) | ClogP |
|---|---|---|---|---|---|---|---|
| Example 65 | TMAH | 5 | | | Citric acid | 0.5 | −1.72 |
| Example 66 | TMAH | 5 | | | Citric acid | 0.5 | −1.72 |
| Example 67 | TMAH | 5 | | | Citric acid | 0.5 | −1.72 |
| Example 68 | TMAH | 5 | | | Citric acid | 0.5 | −1.72 |
| Example 69 | TPAH | 5 | Molybdic acid | 0.01 | | | |
| Example 70 | TBAH | 5 | Molybdic acid | 0.01 | | | |

TABLE 9-continued

|  | Alkali compound (A) | | Polyacid compound (B) | | Hydroxycarboxylic acid (C) | | |
|---|---|---|---|---|---|---|---|
| 3-1 of Table 1 | Type | Content (% by mass) | Type | Content (% by mass) | Type | Content (% by mass) | ClogP |
| Example 71 | TEAH | 5 | | | Citric acid | 0.5 | −1.72 |
| Example 72 | TBAH | 5 | | | Citric acid | 0.5 | −1.72 |
| Example 73 | TMAH | 5 | Molybdic acid | 0.01 | | | |
| Example 74 | TMAH | 5 | Molybdic acid | 0.01 | | | |
| Example 75 | TMAH | 5 | Molybdic acid | 0.01 | | | |
| Example 76 | TMAH | 5 | Molybdic acid | 0.01 | | | |
| Example 77 | TMAH | 5 | Molybdic acid | 0.01 | | | |
| Comparative Example 1 | TMAH | 5 | | | | | |
| Comparative Example 2 | | | Molybdic acid | 0.01 | | | |
| Comparative Example 3 | | | | | Citric acid | 0.5 | −1.72 |
| Comparative Example 4 | TMAH | 10 | | | Citric acid | 0.008 | −1.72 |
| Comparative Example 5 | TMAH | 0.9 | | | Citric acid | 1 | −1.72 |

TABLE 10

|  | Hydroxylamine Derivative (D) | | Organic solvent 1 | | Organic solvent 2 | | Anticorrosive agent against W | | |
|---|---|---|---|---|---|---|---|---|---|
| 3-2 of Table 1 | Type | Content (% by mass) | Type | Content (% by mass) | Type | Content (% by mass) | Type | Content (% by mass) | pH adjuster |
| Example 65 | HA | 10 | TPGME | 70 | | | PEI (MW 3,000) | 0.01 | MSA/DBU |
| Example 66 | HA | 10 | DMSO | 70 | | | PEI (MW 3,000) | 0.01 | MSA/DBU |
| Example 67 | HA | 10 | PG | 70 | | | PEI (MW 3,000) | 0.01 | MSA/DBU |
| Example 68 | HA | 10 | DPG | 70 | | | PEI (MW 3,000) | 0.01 | MSA/DBU |
| Example 69 | HA | 10 | DEGBE | 60 | HG | 10 | | | MSA/DBU |
| Example 70 | HA | 10 | DEGBE | 60 | HG | 10 | | | MSA/DBU |
| Example 71 | HA | 10 | DEGBE | 60 | HG | 10 | | | MSA/DBU |
| Example 72 | HA | 10 | DEGBE | 60 | HG | 10 | | | MSA/DBU |
| Example 73 | HA | 10 | DEGBE | 60 | HG | 10 | | | MSA/DBU |
| Example 74 | HA | 10 | DEGBE | 60 | HG | 10 | L-Arginine | 1 | MSA/DBU |
| Example 75 | HA | 10 | DEGBE | 60 | HG | 10 | PEI (MW 500) | 0.01 | MSA/DBU |
| Example 76 | HA | 10 | DEGBE | 60 | HG | 10 | 3-Amino-1,2,4-triazole | 1 | MSA/DBU |
| Example 77 | HA | 10 | DEGBE | 60 | HG | 10 | PAA (MW 3,000) | 0.5 | MSA/DBU |
| Comparative Example 1 | | | DEGBE | 70 | HG | 10 | | | MSA/DBU |
| Comparative Example 2 | HA | 10 | DEGBE | 70 | HG | 10 | | | MSA/DBU |
| Comparative Example 3 | HA | 10 | DEGBE | 70 | HG | 10 | | | MSA/DBU |
| Comparative Example 4 | HA | 10 | DEGBE | 60 | HG | 10 | | | MSA/DBU |
| Comparative Example 5 | HA | 10 | DEGBE | 60 | HG | 10 | | | MSA/DBU |

TABLE 11

| 3-3 of Table 1 | pH | Water (% by mass) | Electrical conductivity (mS/cm) | Content mass ratio | | | |
|---|---|---|---|---|---|---|---|
| | | | | B/A | C/A | B/D | C/D |
| Example 65 | 8 | Balance | 1,952 | | 0.1 | | 0.05 |
| Example 66 | 8 | Balance | 1,782 | | 0.1 | | 0.05 |
| Example 67 | 8 | Balance | 1,892 | | 0.1 | | 0.05 |
| Example 68 | 8 | Balance | 1,811 | | 0.1 | | 0.05 |
| Example 69 | 8 | Balance | 48 | 0.002 | | 0.001 | |
| Example 70 | 8 | Balance | 120 | 0.002 | | 0.001 | |
| Example 71 | 8 | Balance | 47 | | 0.1 | | 0.05 |
| Example 72 | 8 | Balance | 2,100 | | 0.1 | | 0.05 |
| Example 73 | 7.4 | Balance | 952 | 0.002 | | 0.001 | |

TABLE 11-continued

| 3-3 of Table 1 | pH | Water (% by mass) | Electrical conductivity (mS/cm) | Content mass ratio | | | |
|---|---|---|---|---|---|---|---|
| | | | | B/A | C/A | B/D | C/D |
| Example 74 | 8 | Balance | 532 | | | | |
| Example 75 | 8 | Balance | 478 | | | | |
| Example 76 | 8 | Balance | 532 | | | | |
| Example 77 | 8 | Balance | 431 | | | | |
| Comparative Example 1 | 14 | Balance | 512 | | | | |
| Comparative Example 2 | 14 | Balance | 312 | | | 0.001 | |
| Comparative Example 3 | 14 | Balance | 578 | | | | 0.05 |
| Comparative Example 4 | 8 | Balance | 478 | 0.0008 | | | 0.0008 |
| Comparative Example 5 | 8 | Balance | 3,960 | 1.1 | | | 0.1 |

TABLE 12

| 3-4 of Table 1 | Evaluation items | | | | |
|---|---|---|---|---|---|
| | Co ER | AlOx ER | W ER | Resist removal performance | Residue removal performance |
| Example 65 | 6 | 2 | 5 | B | A |
| Example 66 | 10 | 12 | 6 | C | C |
| Example 67 | 3 | 2 | 3 | A | A |
| Example 68 | 2 | 1 | 2 | A | A |
| Example 69 | 13 | 8 | >25 | C | C |
| Example 70 | 19 | 12 | >25 | B | C |
| Example 71 | 15 | 9 | >25 | C | C |
| Example 72 | 17 | 16 | >25 | B | C |
| Example 73 | 12 | 7 | 16 | C | C |
| Example 74 | 9 | 6 | 6 | B | B |
| Example 75 | 6 | 4 | 7 | B | B |
| Example 76 | 8 | 3 | 8 | B | B |
| Example 77 | 5 | 8 | 7 | B | B |
| Comparative Example 1 | 14 | 15 | >25 | D | D |
| Comparative Example 2 | 18 | >25 | 18 | D | D |
| Comparative Example 3 | 15 | >25 | 19 | D | D |
| Comparative Example 4 | 8 | 21 | >25 | D | D |
| Comparative Example 5 | 24 | 12 | >25 | D | D |

In Table 1, "MW number" indicates that the weight-average molecular weight is "number". Further, "Anticorrosive agent for W" represents an anticorrosive agent for tungsten.

In addition, Table 1 is divided into 12 tables, and 1-1 to 1-4, 2-1 to 2-4, and 3-1 to 3-4 are each grouped into sets.

The components and the like of the treatment liquid in each Example are described in Tables (X-1 to X-4) of the respective branch numbers over the corresponding rows of the tables in the set. For example, in Example 1, the treatment liquid contains 5% by mass of TMAH as the alkali compound (A), contains 0.01% by mass of molybdic acid as the polyacid compound (B), contains 60% by mass of DEGBE as the organic solvent, contains 10% by mass of HG as the organic solvent, and uses MSA/DBU for pH adjustment, the balance is water, the pH is 14, the electrical conductivity is 352 mS/cm, B/A is 0.002, the etching rate for Co is 10 Å/min, the etching rate for AlOx is 16 Å/min, the etching rate for W is more than 25 Å/min, the resist removal performance is shown as A, and the residue removal performance is shown as C. The same applies to other Examples and Comparative Examples.

From the results described in Table 1, it was found that the treatment liquids of each of Examples had excellent resist film removal performance and excellent residue removal performance. On the other hand, in the chemical liquids of Comparative Examples, neither the resist removal performance nor the residue removal performance reached the desired levels.

Furthermore, the treatment liquid of Example 8 containing a hydroxycarboxylic acid having a C Log P value of −1 or less had more excellent resist removal performance, more excellent residue removal performance, more excellent anticorrosion performance against cobalt, and more excellent anticorrosion performance against tungsten, as compared with the treatment liquid of Example 19.

Moreover, the treatment liquid of Example 60 in which the content of the organic solvent was 30% to 95% by mass with respect to the total mass of the chemical liquid had more excellent resist removal performance, more excellent residue removal performance, more excellent anticorrosion performance against cobalt, more excellent anticorrosion performance against AlOx, and more excellent anticorrosion performance against W, as compared with the chemical liquid 57.

In addition, the treatment liquid of Example 60 in which the content of the organic solvent was 60% to 95% by mass with respect to the total mass of the chemical liquid had more excellent resist removal performance, more excellent residue removal performance, more excellent anticorrosion performance against cobalt, more excellent anticorrosion performance against AlOx, and more excellent anticorrosion performance against W, as compared with the chemical liquid 58.

Furthermore, the treatment liquid of Example 7 containing the hydroxylamine compound had more excellent residue removal performance, as compared with the treatment liquid of Example 1.

What is claimed is:
1. A treatment liquid comprising:
at least one alkali compound selected from the group consisting of a quaternary ammonium salt and an inorganic alkali compound;
an organic solvent;
a hydroxycarboxylic acid, and an anticorrosive agent for tungsten (W) selected from the group consisting of carboxylic acid-containing polymers, polyacrylamide, polymethacrylamide and polyethylenimine,
wherein abrasive particles are not substantially contained, and a content mass ratio of a content of the hydroxycarboxylic acid to a content of the alkali compound is 0.001 to 0.15,
the organic solvent is an alcohol-based solvent, an ether-based solvent, or a mixture thereof, and
the content of the organic solvent is 60% to 95% by mass with respect to a total mass of the treatment liquid.

2. The treatment liquid according to claim 1,
wherein a C log P value of the hydroxycarboxylic acid is −1 or less.

3. The treatment liquid according to claim 1,
wherein the hydroxycarboxylic acid is at least one selected from the group consisting of citric acid, tartaric acid, glycolic acid, 2-hydroxyisobutyric acid, glyceric acid, malic acid, and gluconic acid.

4. The treatment liquid according to claim 1,
wherein the content of the hydroxycarboxylic acid is 0.01 ppm by mass to 5% by mass with respect to a total mass of the treatment liquid.

5. The treatment liquid according to claim 1,
wherein an electrical conductivity is 50 to 10,000 mS/cm.

6. The treatment liquid according to claim 1,
wherein the treatment liquid is at least one selected from the group consisting of an etching liquid and a washing liquid.

7. The treatment liquid according to claim 1,
wherein a pH is 7.5 to 14.

8. The treatment liquid according to claim 1,
wherein the alkali compound includes a quaternary ammonium salt.

9. The treatment liquid according to claim 1, further comprising:
a hydroxylamine compound.

10. A method for treating a laminate having a substrate and at least one layer selected from the group consisting of a resist layer and a metal-containing layer, arranged on the substrate, the method comprising at least one step selected from the group consisting of:
a step of removing at least one layer selected from the group consisting of the resist layer and the metal-containing layer on the substrate using the treatment liquid according to claim 1; and
a step of removing a residue derived from at least one layer selected from the group consisting of the resist layer and the metal-containing layer on the substrate using the treatment liquid.

11. The treatment method according to claim 10,
wherein the metal-containing layer contains at least one metal selected from the group consisting of Ti, Hf, Ta, and Zr.

12. The treatment method according to claim 10,
wherein the laminate further has a layer containing Co.

13. The treatment method according to claim 10,
wherein the laminate further has a layer containing Al, $AlO_x$, and AlN, and x is a number of 1 to 3.

14. The treatment method according to claim 10,
wherein the laminate further has a layer containing W.

15. The treatment method according to claim 10,
wherein a temperature of the treatment liquid during the treatment is 23° C. to 75° C.

16. The treatment method according to claim 10,
wherein the substrate has a layer containing at least one selected from the group consisting of Co, Al, $AlO_x$, and AlN, x is a number of 1 to 3, and an etching removal rate of the layer derived from values before and after the treatment is 3.0 nm or less.

17. A treatment liquid comprising:
at least one polyacid compound selected from the group consisting of an isopolyacid and a heteropolyacid;
an organic solvent; and
an alkali compound,
wherein abrasive particles are not substantially contained,
the content of the organic solvent is 60% to 95% by mass with respect to a total mass of the treatment liquid, and
the alkali compound is a compound represented by Formula (1),

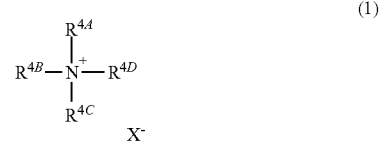

(1)

in Formula (1), $R^{4A}$ to $R^{4D}$ each independently represents an alkyl group having 1 to 6 carbon atoms, a hydroxyalkyl group having 1 to 6 carbon atoms, a benzyl group, or an aryl group, and $X^-$ represents a counter anion.

18. The treatment liquid according to claim 17,
wherein a content of the polyacid compound is 0.01 ppm by mass to 5% by mass with respect to a total mass of the treatment liquid.

19. The treatment liquid according to claim 17,
wherein a content mass ratio of a content of the polyacid compound to a content of the alkali compound is 1 or less.

* * * * *